United States Patent
Kim et al.

(10) Patent No.: US 8,779,549 B2
(45) Date of Patent: Jul. 15, 2014

(54) SEMICONDUCTOR MEMORY DEVICE HAVING CAPACITOR AND SEMICONDUCTOR DEVICE

(75) Inventors: Seung-mo Kim, Anyang-si (KR); Ji-woong Sue, Yongin-si (KR); Jin-kyu Park, Seocho-gu (KR); Young-kwan Park, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 411 days.

(21) Appl. No.: 13/194,086

(22) Filed: Jul. 29, 2011

(65) Prior Publication Data
US 2012/0049380 A1    Mar. 1, 2012

(30) Foreign Application Priority Data
Aug. 31, 2010  (KR) .................. 10-2010-0084896

(51) Int. Cl.
*H01L 21/02* (2006.01)

(52) U.S. Cl.
USPC .............. 257/532; 257/296; 257/E21.008; 438/396

(58) Field of Classification Search
CPC ...... H01L 27/101; H01L 27/108; H01L 28/40
USPC ............... 257/296, 301, 306, 532, E21.001, 257/E21.011, E21.008; 438/386, 387, 396, 438/397; 365/149, 49.12, 51
See application file for complete search history.

(56) References Cited

U.S. PATENT DOCUMENTS

| | | | |
|---|---|---|---|
| 7,387,939 B2 * | 6/2008 | Manning | 438/396 |
| 2009/0068814 A1 * | 3/2009 | Cho et al. | 438/386 |
| 2009/0206448 A1 * | 8/2009 | Cho et al. | 257/532 |
| 2009/0294907 A1 | 12/2009 | Tegen et al. | |

FOREIGN PATENT DOCUMENTS

| | | |
|---|---|---|
| KR | 1020090052661 | 5/2009 |
| KR | 100929642 | 12/2009 |

* cited by examiner

*Primary Examiner* — Meiya Li
*Assistant Examiner* — Lauren R Bell
(74) *Attorney, Agent, or Firm* — Harness, Dickey & Pierce, P.L.C.

(57) ABSTRACT

An example embodiment relates to a semiconductor memory device including a plurality of cylindrical bottom electrodes arranged in a first direction and in a second direction. The device includes a supporting base configured to support the plurality of cylindrical bottom electrodes by contacting side surfaces of the plurality of cylindrical bottom electrodes. The supporting base includes first patterns in which first open areas are formed, and second patterns in which second open areas are formed. The first patterns and the second patterns have different oriented shapes.

19 Claims, 16 Drawing Sheets

LAYOUTS OF PANEL-TYPE SUPPORTING BASES

LAYOUTS OF PANEL-TYPE SUPPORTING BASES

SEMICONDUCTOR MEMORY DEVICE HAVING CAPACITOR AND SEMICONDUCTOR DEVICE

CROSS-REFERENCE TO RELATED APPLICATIONS

This application claims priority under 35 U.S.C. §119 to Korean Patent Application No. 10-2008-0084896, filed on Aug. 31, 2010, in the Korean Intellectual Property Office (KIPO), the disclosure of which is incorporated herein in its entirety by reference.

BACKGROUND

1. Field of Invention

Example embodiments of the inventive concepts relate to a semiconductor device, and more particularly, to a semiconductor device including a pillar-type structure, such as a semiconductor memory device including a cylindrical capacitor.

2. Description of Related Art

In semiconductor devices, such as a dynamic random access memory (DRAM), due to increased integration, it is desirable to increase or constantly maintain a capacitance while reducing an area occupied by devices. One technique for increasing capacitance while reducing the area occupied by the device is to form a capacitor that includes a cylindrical bottom electrode or a stacked bottom electrode and to increase the height thereof.

A cylindrical bottom electrode or a stacked bottom electrode has a structure in which the outer surfaces or both the outer surfaces and the inner surfaces of an electrode are used, and thus a cylindrical bottom electrode or a stacked bottom electrode has a feature of having a relatively wide area of the electrode. However, a cylindrical bottom electrode or a stacked bottom electrode having an integrated one cylinder stack (OCS) structure desirably has a relatively tall bottom electrode in order to secure the capacitance desired for operating devices, and thus a bottom electrode may collapse or break before a dielectric material is deposited.

SUMMARY

Some example embodiments of the inventive concepts relate to a semiconductor memory device including a capacitor with a high aspect ratio and sufficient structural reliability.

Some example embodiments of the inventive concepts relate to a semiconductor device including pillar-type structures with high aspect ratios, wherein the pillar-type structures may be formed to have sufficient structural stability.

According to an example embodiment of the inventive concepts, a semiconductor memory device includes a plurality of cylindrical bottom electrodes arranged in a first direction and in a second direction. The device includes a supporting base, which is configured to support the plurality of cylindrical bottom electrodes by contacting side surfaces of the plurality of cylindrical bottom electrodes. The supporting base includes first patterns in which first open areas are formed, and second patterns in which second open areas are formed. The first patterns and the second patterns have different oriented shapes.

The first patterns and the second patterns may be alternately arranged in at least one of the first direction and the second direction. Furthermore, the first patterns and the second patterns may be arranged to contact each other. Furthermore, the second patterns may have a shape of the first patterns rotated at an angle between the first direction and the second direction.

The first open area of the first pattern may include at least one first elongated opening. The second open area of the second pattern may include at least one second elongated opening. The lengthwise direction of the first elongated opening may be parallel to the first direction, and the lengthwise direction of the second elongated opening may be parallel to the second direction.

The plurality of cylindrical bottom electrodes may be arranged to be apart from each other by a first pitch in the first direction and to be apart from each other by a second pitch in the second direction. The first patterns and the second patterns may have dimensions corresponding to n times the first pitch in the first direction and dimensions corresponding to n times the second pitch in the second direction. N may be a natural number equal to or greater than 3.

If n is an odd number, areas of the supporting base corresponding to the first patterns and the second patterns may contact at least portions of side surfaces of $(n+1)^2$ cylindrical bottom electrodes. The first open area of the first pattern may include $(n-1)/2$ first elongated opening(s), and the second open area of the second pattern may include $(n-1)/2$ second elongated opening(s). The first elongated opening(s) may have a dimension corresponding to n times the first pitch in the first direction and a dimension corresponding to the second pitch in the second direction, and the second elongated opening(s) may have a dimension corresponding to the first pitch in the first direction and a dimension corresponding to n times the second pitch in the second direction.

The first elongated opening(s) and the second elongated opening(s) may each contact at least portions of side surfaces of $2(n+1)$ cylindrical bottom electrodes.

If the first open area of the first pattern includes a plurality of the first elongated opening(s) and the second open area of the second pattern includes a plurality of the second elongated opening(s), the first elongated openings may be apart from each other by the second pitch in the second direction, and the second elongated openings may be apart from each other by the first pitch in the first direction.

Some of the cylindrical bottom electrodes, for example fewer than 12% of the of the cylindrical bottom electrodes, may not contact edges of the first elongated opening(s) and the second elongated opening(s).

If n is an even number, areas of the supporting base corresponding to the first patterns and the second patterns may contact at least portions of side surfaces of $n^2$ cylindrical bottom electrodes. The first open area of the first pattern may include n/2 first elongated opening(s), and the second open area of the second pattern may include n/2 second elongated opening(s). The first elongated opening(s) may have a dimension corresponding to $(n-1)$ times the first pitch in the first direction and a dimension corresponding to the second pitch in the second direction, and the second elongated opening(s) may have a dimension corresponding to the first pitch in the first direction and a dimension corresponding to $(n-1)$ times the second pitch in the second direction.

The first elongated opening(s) and the second elongated opening(s) may each contact at least portions of side surfaces of 2n cylindrical bottom electrodes from contacting the supporting base.

The supporting base may include third patterns in which third open areas are formed and fourth patterns in which fourth open areas are formed. The first through fourth patterns may have different oriented shapes. The first pattern and the second pattern may be alternately arranged in the first direction, and the third pattern and the fourth pattern may be alternately arranged in the first direction, and the first pattern and the third pattern may be alternately arranged in the second direction, and the second pattern and the fourth pattern may be alternately arranged in the second direction.

The first open area of the first pattern may include at least one first elongated opening of which the lengthwise direction is parallel to the first direction. The second open area of the second pattern may include at least one second elongated opening of which the lengthwise direction is parallel to the second direction. The third open area of the third pattern may include at least one third elongated opening of which the lengthwise direction is parallel to the second direction. The fourth open area of the fourth pattern may include at least one fourth elongated opening of which the lengthwise direction is parallel to the first direction.

The first direction and the second direction may form a right angle, and the plurality of cylindrical bottom electrodes may be arranged in a perpendicular matrix. Alternatively, the first direction and the second direction may form an acute angle, and the plurality of cylindrical bottom electrodes may be arranged in a hexagonal matrix.

An example embodiment relates to a semiconductor memory device including a plurality of cylindrical bottom electrodes arranged in a first direction and in a second direction in a memory cell area. The device includes a supporting base configured to support the plurality of cylindrical bottom electrodes by contacting at least portions of side surfaces of the plurality of cylindrical bottom electrodes. The supporting base includes a plurality of first open areas and second open areas having different oriented shapes.

Each of the first open areas may include at least one first elongated opening having a lengthwise direction parallel to the first direction, and each of the second open areas includes at least one second elongated opening having a lengthwise direction parallel to the second direction. The first open areas and the second open areas may be alternately arranged in at least one of the first direction and the second direction.

According to an example embodiment, a semiconductor device includes a substrate, a plurality of pillar-type structures arranged in a first direction and a second direction, and a supporting base configured to support the plurality of pillar-type structures by contacting at least portions of side surfaces of the plurality of pillar-type structures. The supporting base includes first patterns in which first open areas are formed, and second patterns in which second open areas are formed. The first patterns and the second patterns have different oriented shapes.

The first patterns and the second patterns may be alternately arranged. The pillar-type structures may be cylindrical-shaped electrodes. The first open areas may be elongated in the first direction and the first open areas may not be formed on the edge areas of the supporting base.

The pillar-type structures may include a bottom electrode, the bottom electrode standing vertically on the substrate. The device may include a top electrode, where the top electrode includes at least portions between the bottom electrode and the supporting base.

The device may be configured so the second open areas are elongated in the second direction. The pillar-type structures may include TiN or poly-silicon, and have an aspect ratio of about 10 to about 30.

BRIEF DESCRIPTION OF THE DRAWINGS

Example embodiments of the inventive concepts will be more clearly understood from the following brief description taken in conjunction with the accompanying drawings.

FIG. 4A shows open ratio, that is ratio of open areas with respect to the entire areas of the layouts supporting bases, and FIG. 4B shows bending in the first direction and the second direction with respect to layouts of supporting bases;

Figure 1:
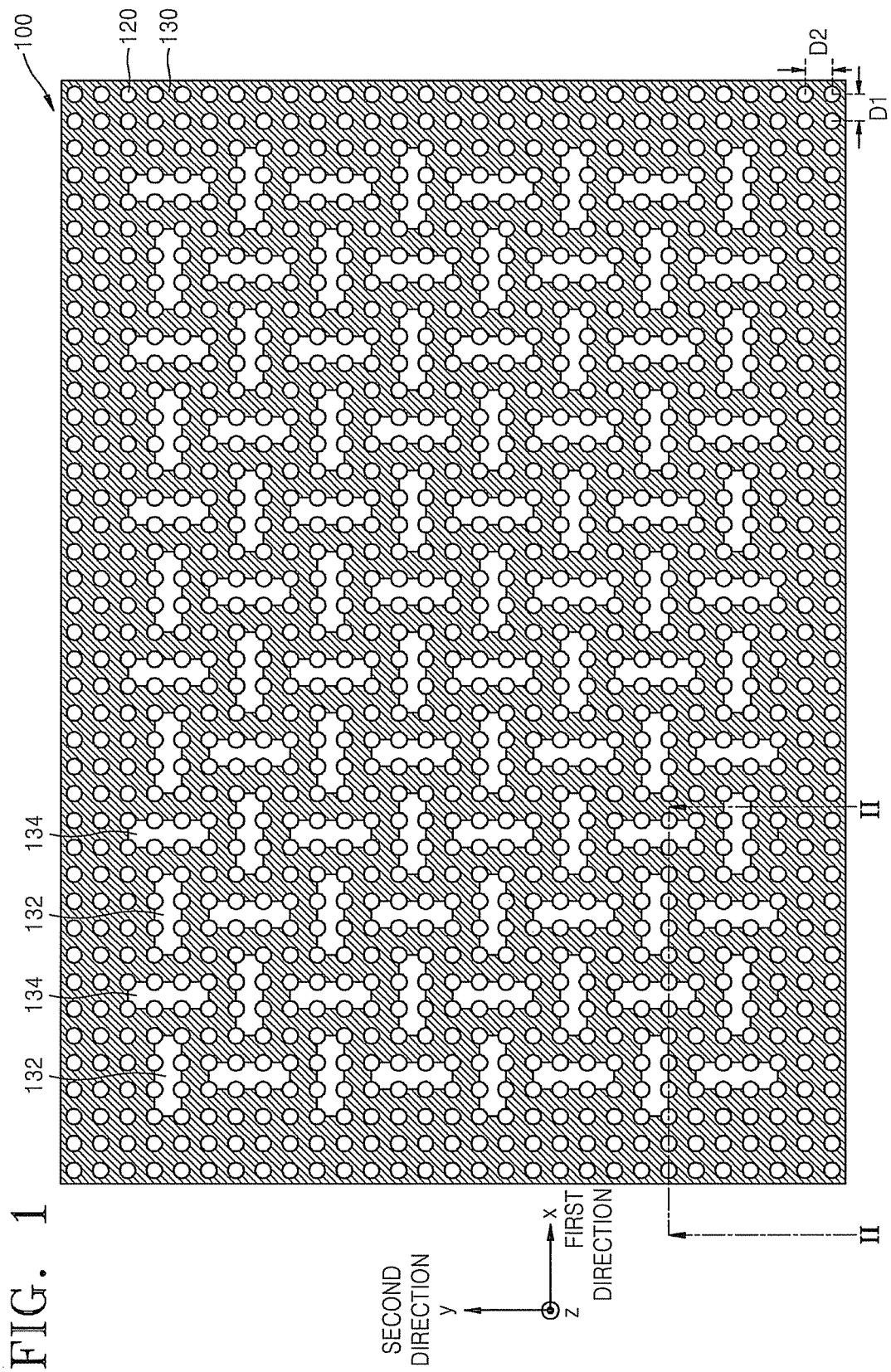
FIG. 1 is a plan view showing pillar-type structures of a semiconductor device and a supporting base configured to support the pillar-type structures according to an example embodiment of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of like reference numbers in the various drawings is intended to indicate the presence of like elements or features.

DETAILED DESCRIPTION

Example embodiments will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the inventive concepts to those of ordinary skill in the art. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, components, areas, layers and/or sections, these elements, components, areas, layers and/or sections should not be limited by these terms. These terms are only used to distinguish one element, component, area, layer or section from another area, layer or section.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Like numbers refer to like elements throughout. It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As such, variations from the shapes of the illustrations as a result, for example, of manufacturing techniques and/or tolerances, are to be expected. Thus, example embodiments of the inventive concepts should not be construed as limited to the particular shapes of areas illustrated herein but are to include deviations in shapes that result, for example, from manufacturing.

Figure 2:
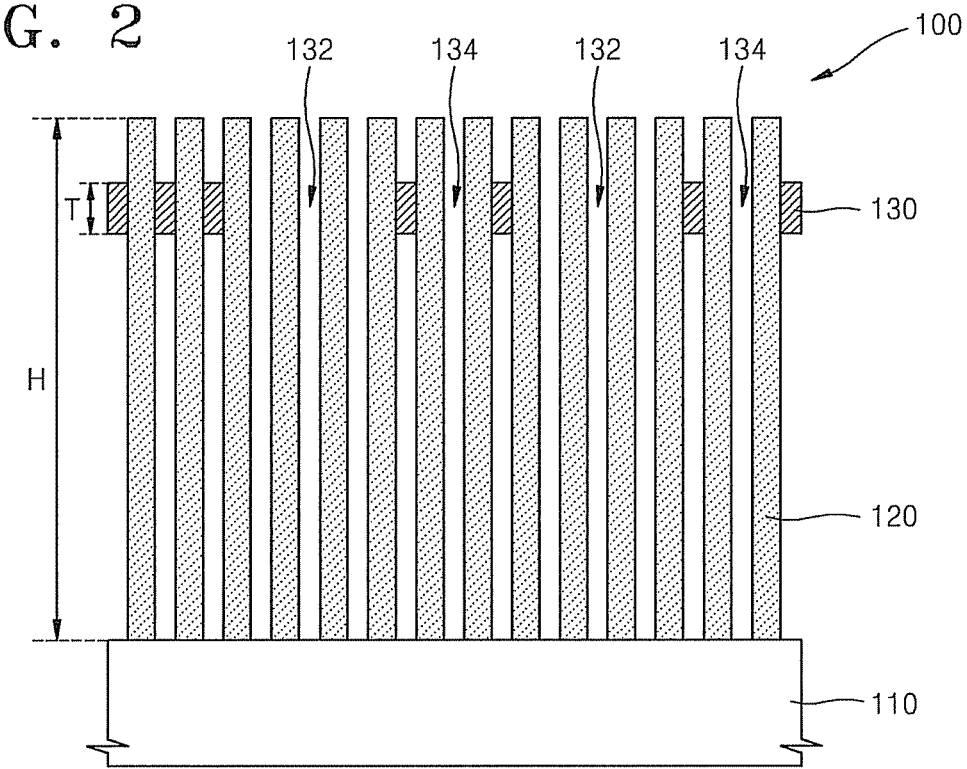
FIG. 2 is a sectional view of the semiconductor device taken along a line II-II' of FIG. 1.

FIG. 1 is a plan view showing pillar-type structures 120 of a semiconductor device 100 according to an example embodiment of the inventive concepts and an arrangement of a supporting base for supporting the pillar-type structures. FIG. 2 is a sectional view of the semiconductor device 100 taken along a line II-II' of FIG. 1. The pillar-type structures 120 are arranged in a first direction and a second direction.

Referring to FIGS. 1 and 2, the semiconductor device 100 includes a substrate 110, a plurality of pillar-type structures 120, and a supporting base 130.

The substrate 110 may be formed of a silicon substrate, a silicon-on-insulator (SOI) substrate, a silicon-germanium substrate, a gallium-arsenic substrate, a ceramic substrate, a quartz substrate, or a glass substrate. Other substrate materials may function sufficiently and the example embodiment is not limited to the aforementioned substrate materials. Unit devices (not shown) required for forming various types of semiconductor devices, such as active devices and passive devices, may be formed on the substrate 110, for example. The unit devices may be cell transistors of a memory device, such as a dynamic random access memory (DRAM) and a flash memory, and more particularly, may be DRAM cell transistors having unit cell sizes of $6F^2$ or $4F^2$. However, the example embodiment is not limited thereto. Here, 1F refers to the minimum feature size.

Device isolating layers (not shown) for isolating the unit devices stated above may be formed on the substrate 110. An interlayer insulation layer (not shown) covering the unit devices may be formed on the substrate 110. Furthermore, conductive areas (not shown), which may be electrically connected to the unit devices via the interlayer insulation layer, may be formed on the substrate 110. Furthermore, conductive wires (not shown) connecting the unit devices or the conductive areas may be formed on the substrate 110.

The pillar-type structures 120 may be repetitively arranged along a first direction (e.g., the x-axis direction) and a second direction (e.g., the y-axis direction) as shown in FIG. 1. As shown in FIG. 1, the pillar-type structures 120 may be arranged in the first direction to be apart from each other by a first pitch D1, and may be arranged in the second direction to be apart from each other by a second pitch D2. Although FIG. 1 shows that the first pitch D1 and the second pitch D2 are almost identical to each other, the example embodiment of inventive concepts is not limited thereto.

A greater or lower number of pillar-type structures 120 than the number of pillar-type structures 120 shown in FIG. 1 may be arranged. For example, if the pillar-type structures 120 constitute a bottom electrode of DRAM cell capacitors, millions of pillar-type structures 120 may be densely arranged on the substrate 110.

Bottoms of the pillar-type structures 120 are fixed to the substrate 110, and the pillar-type structures 120 may have a long and narrow shape extending in a direction (e.g., the z-axis direction) perpendicular to the first direction and the second direction. The aspect ratio, which is a ratio of the height with respect to the width, of the pillar-type structures 120 may be from about 10 to about 30. For example, the aspect ratio of the pillar-type structures 120 may be 20. For example, the width of the pillar-type structures 120 may be from about 30 nm to about 100 nm. For example, the width of the pillar-type structures 120 may be about 50 nm. The height of the pillar-type structures 120 may be from about 1000 nm to about 4000 nm. For example, the height of the pillar-type structures 120 may be about 1200 nm.

The pillar-type structures 120 may constitute a bottom electrode of DRAM cell capacitors, for example. In this case, the pillar-type structures 120 may have a cylindrical shape. Furthermore, the pillar-type structures 120 may be connected to source/drain regions (not shown) of a DRAM cell transistor (not shown) formed in the substrate 110 via a capacitor contact plug (not shown). However, the example embodiment of the inventive concepts is not limited thereto, and the example embodiment of the inventive concepts may be applied to various structures, which have high aspect ratios and are repetitively arranged.

The pillar-type structures 120 having a high aspect ratio may not be able to stand vertically by themselves and may lean toward adjacent pillar-type structures 120 or may break. The supporting base 130 may be provided to support the pillar-type structures 120, so that the pillar-type structures 120 may stand vertically and are apart from each other. The supporting base 130 supports the pillar-type structures 120 by contacting at least portions of side surfaces of the pillar-type structures 120. The supporting base 130 may be a panel-type component, which is arranged at a desired (or alternatively predetermined) height of the pillar-type structures 120 to be parallel to the substrate 110.

A plurality of open areas including first open areas 132 and second open areas 134 may be formed in the supporting base 130. The first open areas 132 and the second open areas 134 may be repetitively formed in the supporting base 130. The first open areas 132 and the second open areas 134 may be alternately arranged in either the first direction or the second direction. Alternatively, as shown in FIG. 1, the first open areas 132 and the second open areas 134 may be alternately arranged in both the first direction and the second direction.

As the first open areas 132 and the second open areas 134 are formed in the supporting base 130, the following operations may be performed to portions of the pillar-type structures 120 located below the supporting base 130 as shown in FIG. 2. For example, in the case where the pillar-type structures 120 constitute a bottom electrode of DRAM cell capacitors, a dielectric layer 222 and a top electrode 224 may be formed on surfaces of the pillar-type structures 120 (refer to FIG. 5G).

As shown in FIG. 2, the supporting base 130 may be arranged at a desired (or alternatively predetermined) height of the pillar-type structures 120. For example, the supporting base 130 may be arranged above the centers of the pillar-type structures 120. For example, the supporting base 130 may be arranged at a height above about $7/10$ of a height H of the pillar-type structures 120. Alternatively, the supporting base 130 may be arranged on top of the pillar-type structures 120 not to protrude the pillar-type structures 120 upward from the supporting base 130.

The supporting base 130 may have a thickness T corresponding to from about $1/10$ to about $2/10$ of the height H of the pillar-type structures 120. Furthermore, the supporting base 130 may include a plurality of supporting layers for supporting the pillar-type structures 120. For example, if the supporting base 130 includes two supporting layers, a first supporting layer may be arranged at a desired (or alternatively predetermined) height to support the middle portions of the pillar-type structures 120, whereas a second supporting layer may be arranged to support the upper portions of the pillar-type structures 120.

The first and second open areas 132 and 134 may have different oriented shapes, and/or different shapes (not shown) and/or different sized shapes (not shown). For example, the first open areas 132 may include at least one first elongated opening, of which the lengthwise direction is parallel to the first direction, whereas the second open areas 134 may include at least one second elongated opening, of which the lengthwise direction is parallel to the second direction. The first open areas 132 may have the same size as the second open areas 134, whereas the shape of the first open areas 132 may correspond to the shape of the second open areas 134 rotated at an angle between the first and second directions.

Here, the term "elongated" shape refers to a shape that a dimension in a first direction is longer than a dimension in a second direction different from the first direction. For example, a shape of which a dimension in the first direction is twice or more longer than a dimension in the second direction may be referred to as an elongated shape herein. Furthermore, the first direction, that is, the direction corresponding to a longer dimension may be referred to as a lengthwise direction, whereas the second direction, that is, the direction corresponding to a shorter dimension may be referred to as a widthwise direction.

As shown in FIG. 1, the first open areas 132 may be formed between the eight pillar-type structures 120 arranged in a 2×4 matrix, and side surfaces of the eight pillar-type structures 120 arranged in a 2×4 matrix may include open areas as the first open areas 132 are formed in the supporting base 130. Furthermore, the second open areas 134 may be formed between the eight pillar-type structures 120 arranged in a 4×2 matrix, and side surfaces of the eight pillar-type structures 120 arranged in a 4×2 matrix may include open areas as the second open areas 134 are formed in the supporting base 130.

Here, the pillar-type structures 120 arranged in a 2×4 matrix refer to the eight pillar-type structures 120 including two rows in the first direction and four columns in the second direction, and more particularly, to the pillar-type structures 120 including open areas, which are not covered by the supporting base 130 due to the first open areas 132, as shown in FIG. 1. In the same regard, the pillar-type structures 120 arranged in a 4×2 matrix refer to the eight pillar-type struc- tures 120 including four rows in the first direction and two columns in the second direction.

Furthermore, if the pillar-type structures 120 are arranged to be apart from each other by the first pitch D1 in the first direction and to be apart from each other by the second pitch D2 in the second direction, the first open areas 132 may have a shape with a dimension 3×D1 in the first direction, which is three times longer than the first pitch D1, and a dimension D2 in the second direction, which is identical to the second pitch D2. For example, the first open areas 132 may have a shape approximate to a rectangle, a parallelogram, or an ellipse. Furthermore, the second open areas 134 may have a shape with a dimension D1 in the first direction, which is identical to the second pitch D1 and a dimension 3×D2 in the second direction, which is three times longer than the second pitch D2. For example, the second open areas 134 may have a shape approximate to a rectangle, a parallelogram, or an ellipse The first and second open areas 132 and 134 may have shapes approximate to rectangles, parallelograms, or ellipses, because, due to a sequence of the fabrication process, the shape of the first and second open areas 132 and 134 before the supporting base 130 is penetrated by the pillar-type structures 120 corresponds to a rectangle, a parallelogram, or an ellipse (refer to FIG. 5B). If descriptions below or claims state a particular pattern or a particular area has a shape of a rectangle, a parallelogram, or an ellipse, it is understood that the rectangle, the parallelogram, or the ellipse does not refer to a shape that is perfectly geometrical and refers to an approximate shape that the first and the second open areas 132 and 134 may have as shown in FIG. 1.

As shown in FIG. 1, the first and second open areas 132 and 134 may not be formed on edge areas of the supporting base 130 to improve structural stability of the supporting base 130. The pillar-type structures 120 penetrating the edge areas of the supporting base 130, in which the first and second open areas 132 and 134 are not formed, may be dummies. For example, if the pillar-type structures 120 constitute a bottom electrode connected to a DRAM cell transistor, a DRAM cell including a capacitor bottom electrode penetrating the edge area may be a dummy cell. Furthermore, an area in which the dummy cells are located may be defined as a dummy area, whereas an area in which active memory cells are located may be defined as a cell area. In this case, the dummy area may be arranged to surround the cell area.

Hereinafter, some example embodiments in which the pillar-type structures 120 of FIG. 1 constitute a cylindrical bottom electrode of a DRAM cell transistor will be described. Although some example embodiments are described in which the pillar-type structures constitute a cylindrical bottom electrode of a DRAM cell transistor, example embodiments of the inventive concepts are not limited thereto.

FIGS. 3A through 3J are enlarged plan views showing portions of cylindrical bottom electrodes and layouts of supporting bases for supporting the cylindrical bottom electrodes of semiconductor memory devices according to some example embodiments of the inventive concepts. For clearer comprehension of the technical spirit of some example embodiments of the inventive concepts, FIGS. 3A through 3J show cylindrical bottom electrodes and supporting bases including selected patterns, but example embodiments of the inventive concepts are not limited to these patterns.

Figure 3A:
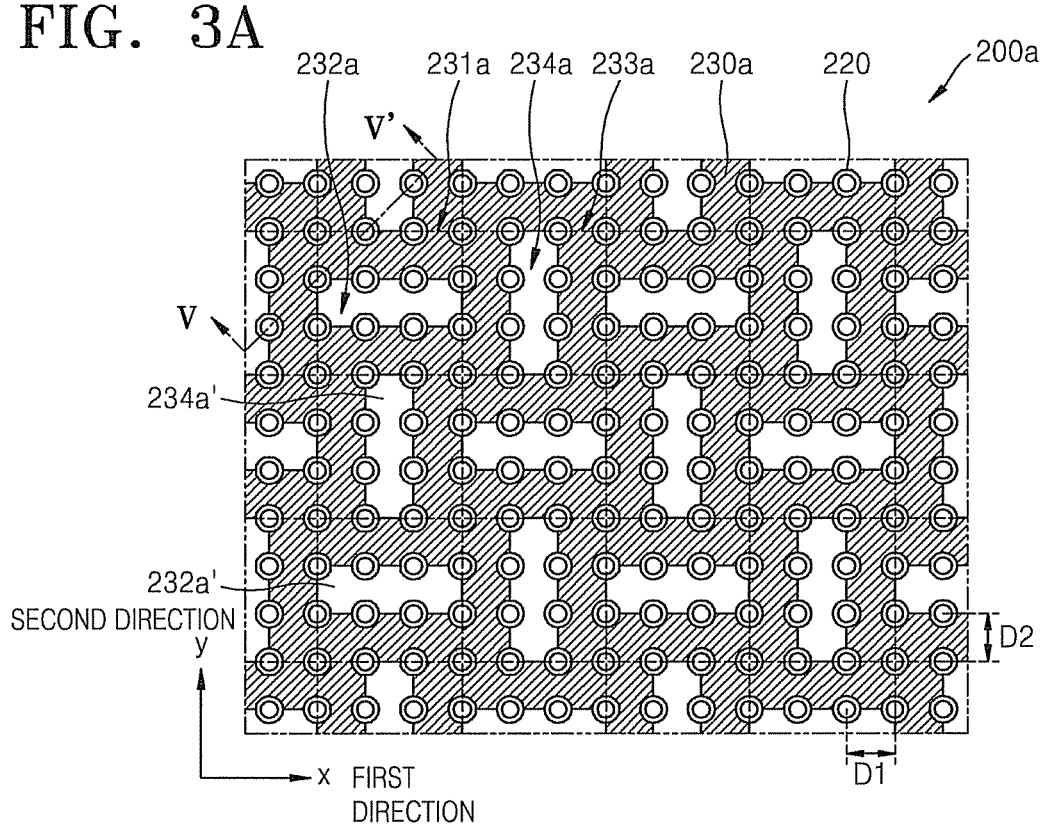
FIGS. 3A through 3J are enlarged plan views showing portions of cylindrical bottom electrodes and layouts of supporting bases configured to support the cylindrical bottom electrodes of semiconductor memory devices according to an example embodiment of the inventive concepts.

Referring to FIG. 3A, a semiconductor memory device 200a includes a plurality of cylindrical bottom electrodes 220 and a supporting base 230a for supporting the cylindrical bottom electrodes 220.

The cylindrical bottom electrodes 220 may be repetitively arranged in a first direction (e.g., the x-axis direction) and in a second direction (e.g., the y-axis direction), and may be arranged in a matrix, for example. The plurality of cylindrical bottom electrodes 220 may be repetitively arranged in the first direction to be apart from each other by the first pitch D1 and may be repetitively arranged in the second direction to be apart from each other by the second pitch D2. In FIG. 3A, each of the plurality of cylindrical bottom electrodes 220 is shown as two concentric circles, where the inner circle indicates the inner side surface of the cylindrical bottom electrode 220, and the outer circle indicates the outer side surface of the cylindrical bottom electrode 220 (refer to FIG. 5F). The above description on the plurality of cylindrical bottom electrodes 220 may be applied to the embodiments shown in FIGS. 3B through 3J, and thus the description will not be repeated below.

The supporting base 230a includes first patterns 231a in which first open areas 232a are formed, and second patterns 233a in which second open areas 234a are formed. The first patterns 231a and the second patterns 233a are areas simply defined for distinguishing various portions of the supporting base 230a. Actually, the first patterns 231a and the second patterns 233a are physically connected to each other and may be defined otherwise with respect to the same supporting base 230a. As shown in FIG. 3A, the first patterns 231a and the second patterns 233a may contact each other and may be alternately arranged in the first direction and the second direction. Furthermore, the first patterns 231a and the second patterns 233a may have shapes rotated at an angle formed between the first direction and the second direction, e.g., 90°. In the example embodiment shown in FIG. 3A, the first patterns 231a and the second patterns 233a may be defined as rectangular or square areas with a dimension 3×D1 in the first direction, which is three times longer than the first pitch D1 (hereinafter, n×D1 will refer to n times D1), and a dimension 3×D2 in the second direction, which is three times longer than the second pitch D2 (hereinafter, n×D2 will refer to n times D2). In this case, each of the first patterns 231a and the second patterns 233a of the supporting base 230a may contact at least portions of side surfaces of the sixteen cylindrical bottom electrodes 220 at a desired (or alternatively predetermined) height.

The first open area 232a may be formed at the center of the first pattern 231a and may include a first elongated opening 232a', which extends in the first direction. The second open area 234a may be formed at the center of the second pattern 233a and may include a second elongated opening 234a', which extends in the second direction. The lengthwise direction of the first elongated opening 232a' may be parallel to the first direction, and may have a dimension 3×D1 in the first direction and a dimension D2 in the second direction, for example. Furthermore, the lengthwise direction of the second elongated opening 234a' may be parallel to the second direction, and may have a dimension D1 in the first direction and a dimension 3×D2 in the second direction, for example. In this case, the first and second elongated openings 232a' and 234a' may prevent at least portions of side surfaces of the eight cylindrical bottom electrodes 220 arranged adjacent to the first and second openings 232a' and 234a' from contacting the supporting base 230a.

As shown in FIG. 3A, if the supporting base 230a includes the first patterns 231a and the second patterns 233a repetitively arranged in the first direction and the second direction, side surfaces of a part of the cylindrical bottom electrodes 220 surrounded by the two first patterns 231a and the two second patterns 233a may not contact edges of the first and second elongated openings 232a' and 234a'. About ⅛ of all of the cylindrical bottom electrodes 220 do not contact the edges of the first and second elongated openings 232a' and 234a'.

Figure 3B:
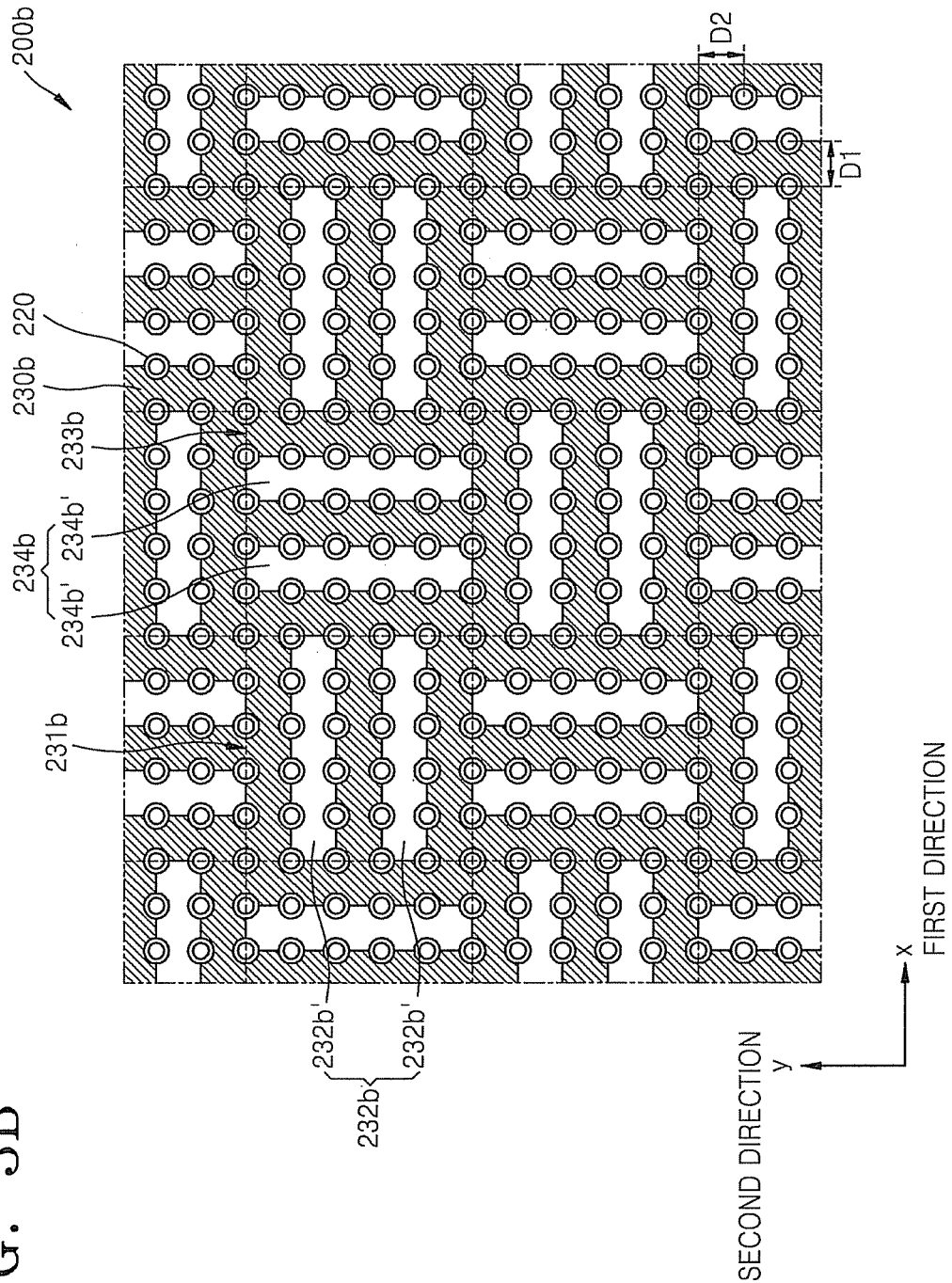

Referring to FIG. 3B, a semiconductor memory device 200b includes the plurality of cylindrical bottom electrodes 220 and a supporting base 230b for supporting the cylindrical bottom electrodes 220.

The supporting base 230b includes first patterns 231b in which first open areas 232b are formed, and second patterns 233b in which second open areas 234b are formed. The first patterns 231b and the second patterns 233b are areas simply defined for distinguishing various portions of the supporting base 230b. As shown in FIG. 3B, the first patterns 231b and the second patterns 233b may contact each other and may be alternately arranged in the first direction and the second direction. In the embodiment shown in FIG. 3B, the first patterns 231b and the second patterns 233b may be defined as rectangular or square areas with a dimension 5×D1 in the first direction and a dimension 5×D2 in the second direction. In this case, each of the first patterns 231b and the second patterns 233b of the supporting base 230b may contact at least portions of side surfaces of the thirty-six cylindrical bottom electrodes 220 at a desired (or alternatively predetermined) height.

The first open area 232b may include two first elongated openings 232b', which extend in the first direction, whereas the second open area 234b may include two second elongated openings 234b', which extend in the second direction. The lengthwise direction of the first elongated openings 232b' may be parallel to the first direction, and may have a dimension 5×D1 in the first direction and a dimension D2 in the second direction, for example. Furthermore, the lengthwise direction of the second elongated openings 234b' may be parallel to the second direction, and may have a dimension D1 in the first direction and a dimension 5×D2 in the second direction, for example. In this case, the first and second openings 232b' and 234b' may prevent at least portions of side surfaces of the ten cylindrical bottom electrodes 220 arranged adjacent to the first and second openings 232b' and 234b' from contacting the supporting base 230b.

As shown in FIG. 3B, if the supporting base 230b includes the first patterns 231b and the second patterns 233b repetitively arranged in the first direction and the second direction, side surfaces of a part of the cylindrical bottom electrodes 220 may not contact edges of the first and second elongated openings 232b' and 234b'. About 1/25 of all of the cylindrical bottom electrodes 220 do not contact the edges of the first and second elongated openings 232b' and 234b'.

Figure 3C:
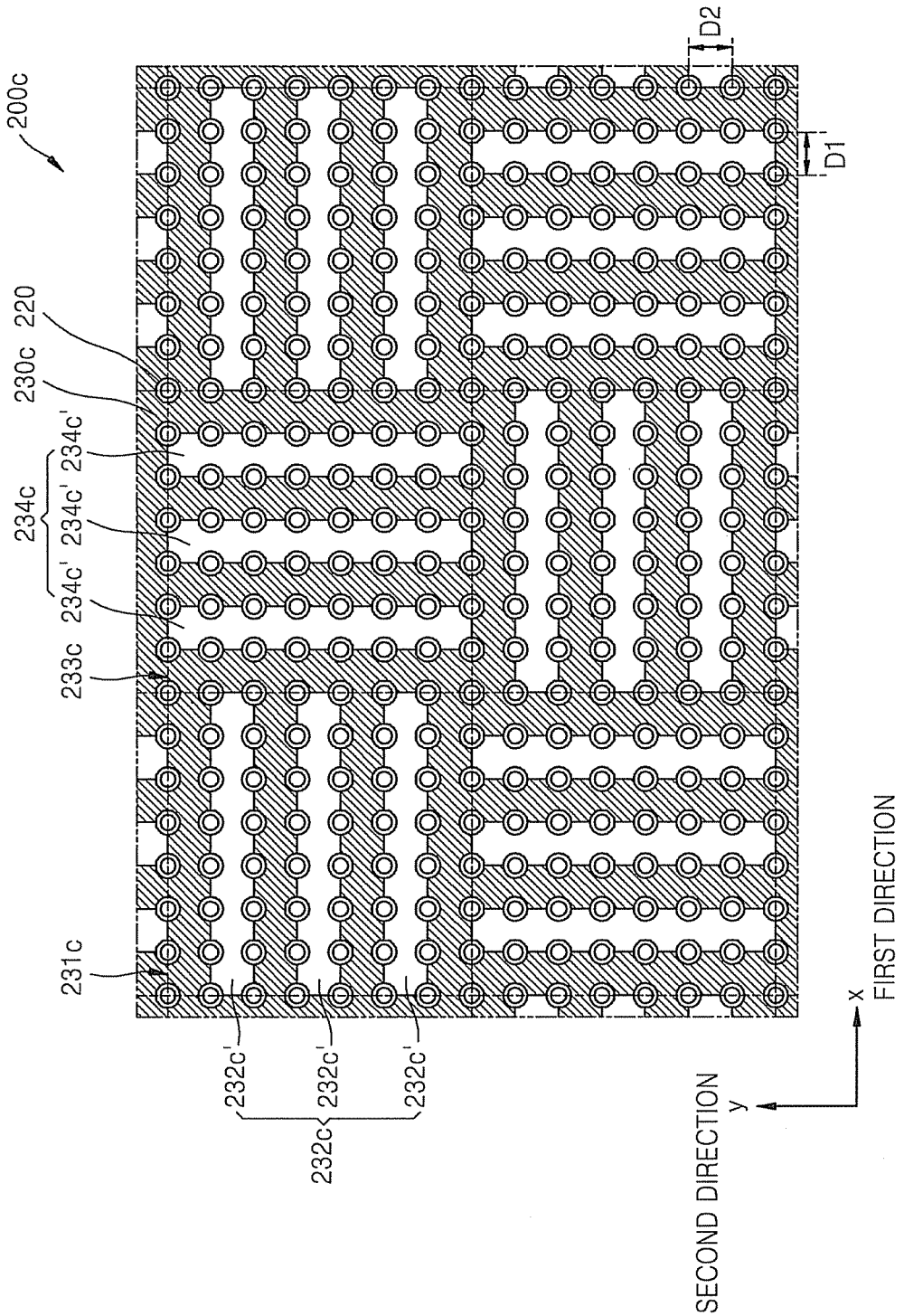

Referring to FIG. 3C, a semiconductor memory device 200c includes the plurality of cylindrical bottom electrodes 220 and a supporting base 230c for supporting the cylindrical bottom electrodes 220.

The supporting base 230c includes first patterns 231c in which first open areas 232c are formed, and second patterns 233c in which second open areas 234c are formed. The first patterns 231c and the second patterns 233c areas are simply defined for distinguishing various portions of the supporting base 230c. As shown in FIG. 3C, the first patterns 231c and the second patterns 233c may contact each other and may be alternately arranged in the first direction and the second direction. In the example embodiment shown in FIG. 3C, the first patterns 231c and the second patterns 233c may be defined as rectangular or square areas with a dimension 7×D1 in the first direction and a dimension 7×D2 in the second direction. In this case, each of the first patterns 231c and the second patterns 233c of the supporting base 230c may contact at least portions of side surfaces of the sixty-four cylindrical bottom electrodes 220 at a desired (or alternatively predetermined) height.

The first open area 232c may include three first elongated openings 232c', which extend in the first direction, whereas the second open area 234c may include three second elongated openings 234c', which extend in the second direction. The first elongated openings 232c' may have a dimension 7×D1 in the first direction and a dimension D2 in the second direction, for example. Furthermore, the second elongated openings 234c' may have a dimension D1 in the first direction and a dimension 7×D2 in the second direction, for example. In this case, the first and second openings 232c' and 234c' may prevent at least portions of side surfaces of the fourteen cylindrical bottom electrodes 220 arranged adjacent to the first and second openings 232c' and 234c' from contacting the supporting base 230c.

As shown in FIG. 3C, if the supporting base 230c includes the first patterns 231c and the second patterns 233c repetitively arranged in the first direction and the second direction, side surfaces of a part of the cylindrical bottom electrodes 220 may not contact edges of the first and second elongated openings 232c' and 234c'. About 1/49 of all of the cylindrical bottom electrodes 220 do not contact the edges of the first and second elongated openings 232c' and 234c'.

The supporting bases 230a through 230c of the semiconductor memory devices 200a through 200c shown in FIGS. 3A through 3C may be generally described as below.

In the case where first patterns and second patterns of a supporting base are defined as rectangular or square areas with a dimension n×D1 in the first direction and a dimension n×D2 in the second direction (where n is an odd number equal to or greater than 3), a first open area of the first pattern includes (n−1)/2 first elongated opening(s) of which the lengthwise direction is parallel to the first direction and a second open area of the first pattern includes (n−1)/2 second elongated opening(s) of which the lengthwise direction is parallel to the second direction, where the first elongated opening(s) has (have) a dimension n×D1 in the first direction and a dimension D2 in the second direction, and the second elongated opening(s) has (have) a dimension D1 in the first direction and a dimension n×D2 in the second direction.

Each of the first elongated opening(s) and the second elongated opening(s) prevents at least portions of side surfaces of the 2×(n+1) cylindrical bottom electrodes from contacting the supporting base. A number of cylindrical bottom electrodes 220 not contacting edges of the first elongated opening (s) and the second elongated opening(s) is approximately $1/n^2$ of a total number of cylindrical bottom electrodes 220. If n is an odd number equal to or greater than 5, the first elongated openings are arranged to be apart from each other by the second pitch D2 in the second direction, and the second elongated openings are arranged to be apart from each other by the first pitch D1 in the first direction.

It is understood that the technical spirit of the example embodiments of the inventive concepts may also be applied not only to the supporting bases, as shown in FIGS. 3A through 3C, in which values of n are respectively 3, 5, and 7, but also to cases in which a value of n is an odd number equal to or greater than 9.

Figure 3D:
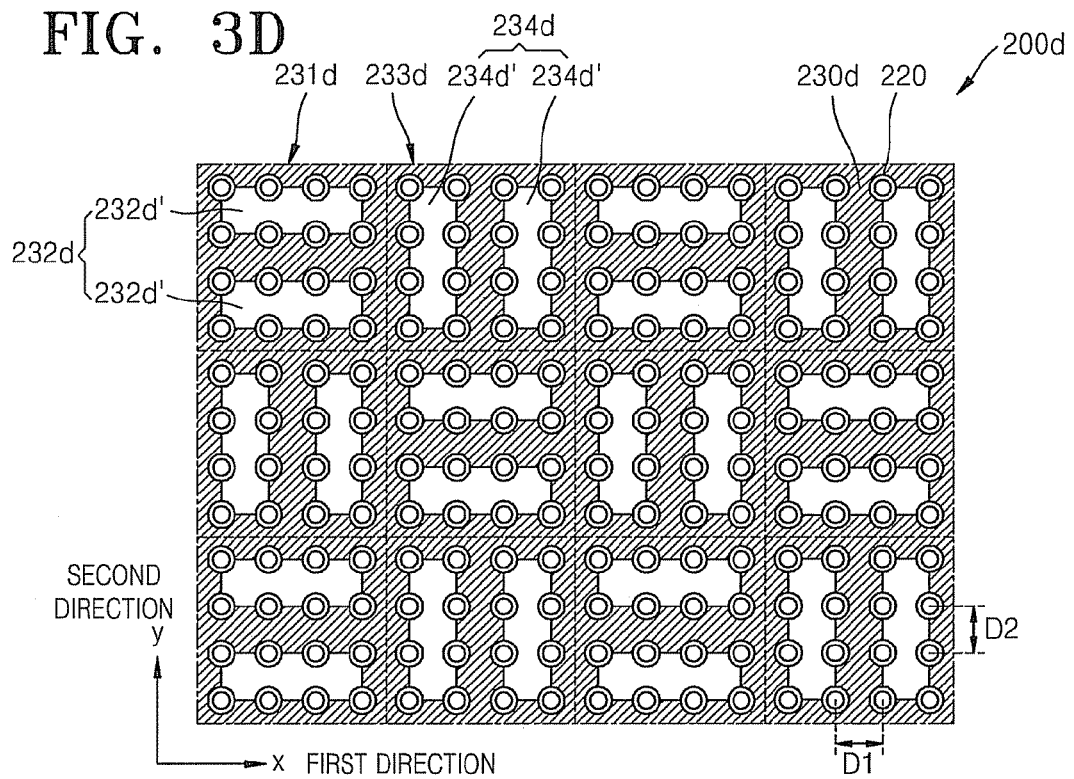

Referring to FIG. 3D, a semiconductor memory device 200d includes the plurality of cylindrical bottom electrodes 220 and a supporting base 230d for supporting the cylindrical bottom electrodes 220.

The supporting base 230d includes first patterns 231d in which first open areas 232d are formed, and second patterns 233d in which second open areas 234d are formed. The first patterns 231d and the second patterns 233d are areas simply defined for distinguishing various portions of the supporting base 230d. As shown in FIG. 3D, the first patterns 231d and the second patterns 233d may contact each other and may be alternately arranged in the first direction and the second direction. In the example embodiment shown in FIG. 3D, the first patterns 231d and the second patterns 233d may be defined as rectangular or square areas with a dimension 4×D1 in the first direction and a dimension 4×D2 in the second direction. In this case, each of the first patterns 231d and the second patterns 233d of the supporting base 230d may be penetrated by the sixteen cylindrical bottom electrodes 220.

The first open area 232d may include two first elongated openings 232d', which extend in the first direction, whereas the second open area 234d may include two second elongated openings 234d', which extend in the second direction. The first elongated openings 232d' may have a dimension 3×D1 in the first direction and a dimension D2 in the second direction, for example. Furthermore, the second elongated openings 234d' may have a dimension D1 in the first direction and a dimension 3×D2 in the second direction, for example.

Figure 3E:
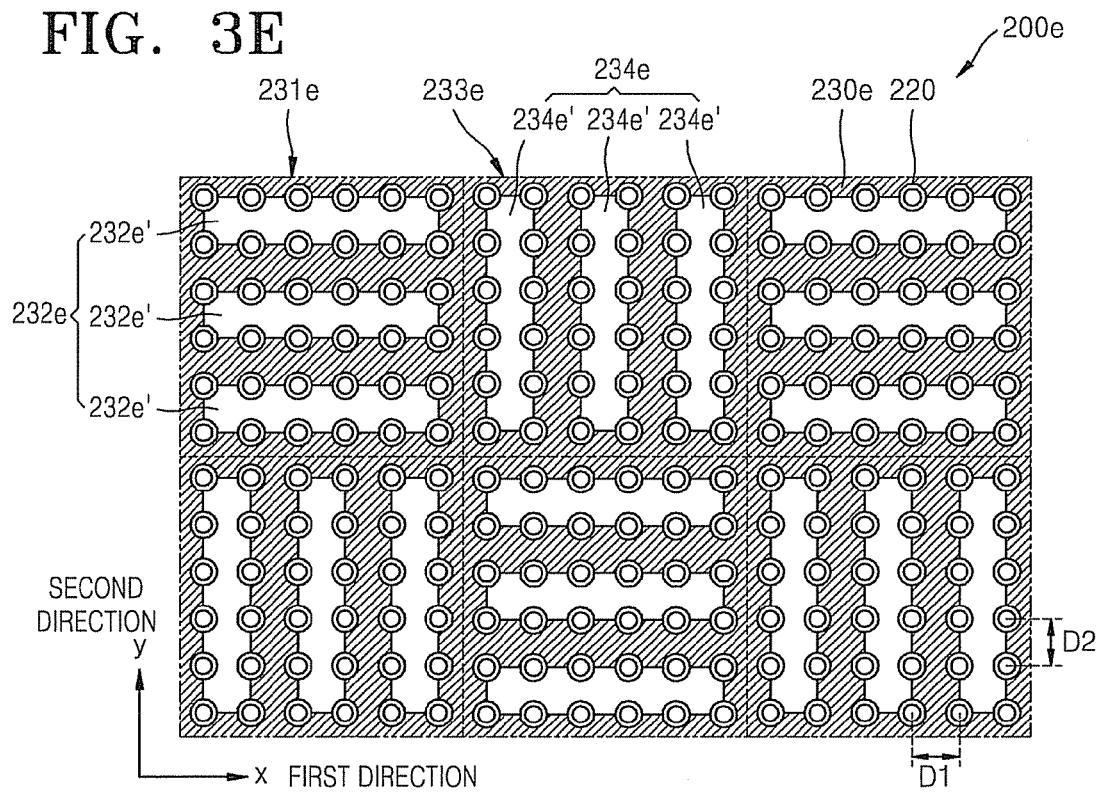

Referring to FIG. 3E, a semiconductor memory device 200e includes the plurality of cylindrical bottom electrodes 220 and a supporting base 230e for supporting the cylindrical bottom electrodes 220.

The supporting base 230e includes first patterns 231e in which first open areas 232e are formed, and second patterns 233e in which second open areas 234e are formed. The first patterns 231e and the second patterns 233e are areas simply defined for distinguishing various portions of the supporting base 230e. As shown in FIG. 3E, the first patterns 231e and the second patterns 233e may contact each other and may be alternately arranged in the first direction and the second direction. In the example embodiment shown in FIG. 3E, the first patterns 231e and the second patterns 233e may be defined as rectangular or square areas with a dimension 6×D1 in the first direction and a dimension 6×D2 in the second direction. In this case, each of the first patterns 231e and the second patterns 233e of the supporting base 230e may be penetrated by the thirty-six cylindrical bottom electrodes 220.

The first open area 232e may include three first elongated openings 232e', which extend in the first direction, whereas the second open area 234e may include three second elongated openings 234e', which extend in the second direction. The first elongated openings 232e' may have a dimension 5×D1 in the first direction and a dimension D2 in the second direction, for example. Furthermore, the second elongated openings 234e' may have a dimension D1 in the first direction and a dimension 5×D2 in the second direction, for example.

As shown in FIGS. 3D and 3E, if the supporting bases 230d and 230e include the first patterns 231d and 231e and the second patterns 233d and 233e repetitively arranged in the first direction and the second direction, portions of side surfaces of all of the cylindrical bottom electrodes 220 within the cell area contact edges of the first elongated openings 232d' and 232e' and the second elongated openings 234d' and 234e'.

The supporting bases 230d and 230e of the semiconductor memory devices 200d and 200e shown in FIGS. 3D and 3E may be generally described as below.

In the case where first patterns and second patterns of a supporting base are defined as rectangular or square areas with a dimension n×D1 in the first direction and a dimension n×D2 in the second direction (where n is an even number equal to or greater than 4), a first open area of the first pattern includes n/2 first elongated openings of which the lengthwise direction is parallel to the first direction and a second open area of the first pattern includes n/2 second elongated openings of which the lengthwise direction is parallel to the second direction, where the first elongated openings have a dimension (n−1)×D1 in the first direction and a dimension D2 in the second direction, and the second elongated openings have a dimension D1 in the first direction and a dimension (n−1)×D2 in the second direction. Each of the first elongated opening(s) and the second elongated opening(s) prevents at least portions of side surfaces of the 2×n cylindrical bottom electrodes from contacting the supporting base. The first elongated openings are arranged to be apart from each other by the second pitch D2 in the second direction, and the second elongated openings are arranged to be apart from each other by the first pitch D1 in the first direction.

It is understood that the technical spirit of the example embodiments of inventive concepts may also be applied not only to the supporting bases, as shown in FIGS. 3D and 3E, in which values of n are respectively 4 and 6, but also to cases in which a value of n is an even number equal to or greater than 8.

Figure 3F:
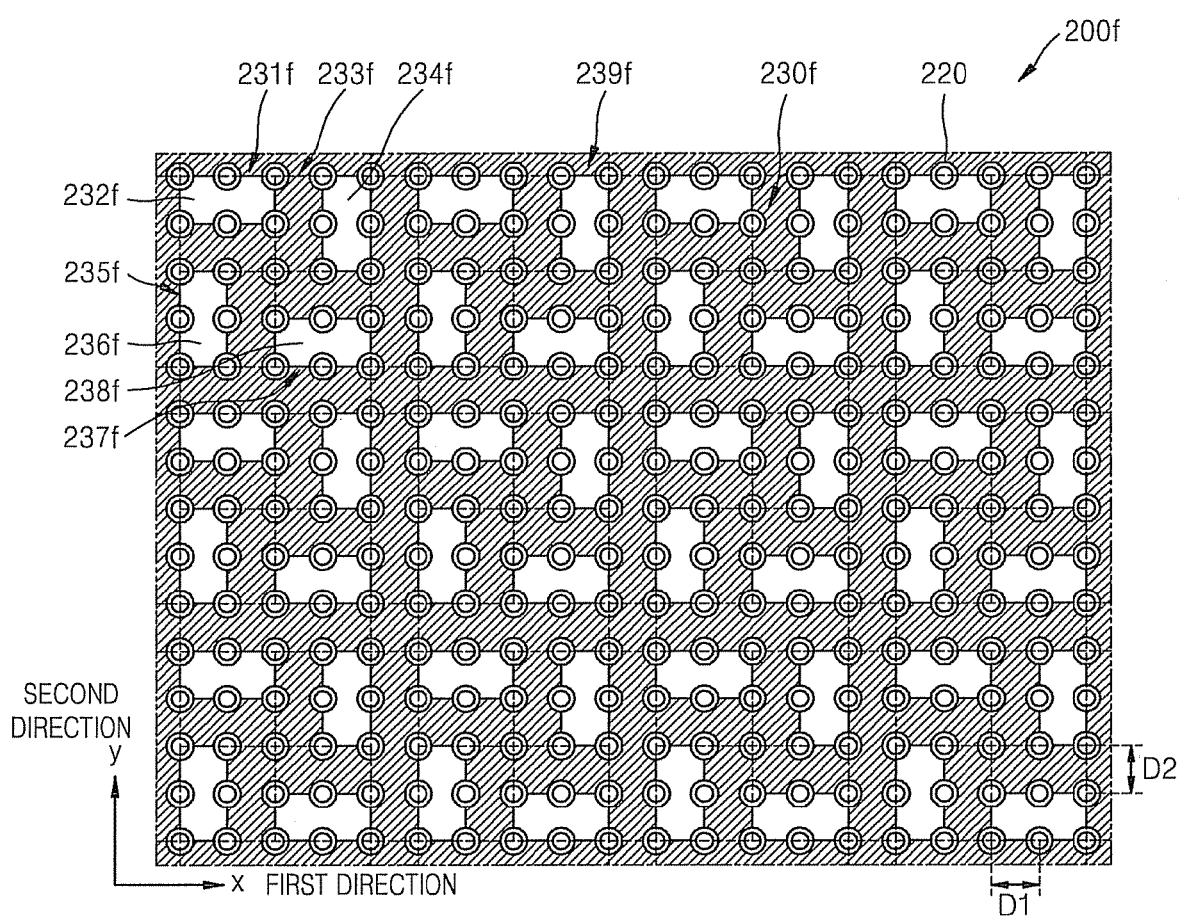

Referring to FIG. 3F, a semiconductor memory device 200f includes the plurality of cylindrical bottom electrodes 220 and a supporting base 230f for supporting the cylindrical bottom electrodes 220.

The supporting base 230f includes first patterns 231f in which first open areas 232f are formed, second patterns 233f in which second open areas 234f are formed, third patterns 235f in which third open areas 236f are formed, and fourth patterns 237f in which fourth open areas 238f are formed. The first through fourth patterns 231f, 233f, 235f, and 237f areas are simply defined for distinguishing various portions of the supporting base 230f. The first pattern 231f arranged in the upper-left portion of the supporting base 230f, the second pattern 233f arranged in the upper-right portion of the supporting base 230f, the third pattern 235f arranged in the lower-left portion of the supporting base 230f, and the fourth pattern 237f arranged in the upper-right portion of the supporting base 230f may be referred to as a group pattern 239f.

As shown in FIG. 3F, the group pattern 239f may be repetitively arranged in the first direction to be apart from each other by D1 and to be apart from each other by D2 in the second direction. Therefore, the first pattern 231f and the second pattern 233f may be alternately arranged in the first direction, and the third pattern 235f and the fourth pattern 237f may be alternately arranged in the first direction. Furthermore, the first pattern 231f and the third pattern 235f may also be alternately arranged in the second direction, and the second pattern 233f and the fourth pattern 237f may also be alternately arranged in the second direction.

In the example embodiment shown in FIG. 3F, the first through fourth patterns 231f, 233f, 235f, and 237f may be defined as rectangular or square areas with a dimension 2×D1 in the first direction and a dimension 2×D2 in the second direction. Furthermore, the group pattern 239f may be defined as a rectangular or square area with a dimension 4×D1 in the first direction and a dimension 4×D2 in the second direction. However, the first through fourth patterns 231f, 233f, 235f, and 237f may be defined otherwise. For example, the first through fourth patterns 231f, 233f, 235f, and 237f may be defined as rectangular or square areas with a dimension 2.5×D1 in the first direction and a dimension 2.5×D2 in the second direction, and the group pattern 239f may be defined as a rectangular or square area with a dimension 5×D1 in the first direction and a dimension 5×D2 in the second direction. In this case, each of the first through fourth patterns 231f, 233f, 235f, and 237f of the supporting base 230f may contact at least portions of side surfaces of the nine cylindrical bottom electrodes 220.

The first and fourth open areas 232f and 238f may have an elongated shape of which the lengthwise direction is parallel to the first direction, where the first and fourth open areas 232f and 238f may have a dimension 2×D1 in the first direction and a dimension D2 in the second direction. Furthermore, the second and third open areas 234f and 236f may have an elongated shape of which the lengthwise direction is parallel to the second direction, where the second and third open areas 234f and 236f may have a dimension D1 in the first direction and a dimension 2×D2 in the second direction. As shown in FIG. 3F, the first open area 232f may be formed on the first pattern 231f, and the fourth open area 238f may be formed below the fourth pattern 237f. Furthermore, the second open area 234f may be formed right to the first pattern 233f, and the third open area 236f may be formed left to the third pattern 235f. In this case, the first through fourth open areas 232f, 234f, 236f, and 238f may prevent at least portions of side surfaces of a part of the six cylindrical bottom electrodes 220 arranged adjacent to the first through fourth open areas 232f, 234f, 236f, and 238f from contacting the supporting base 230f.

As shown in FIG. 3F, side surfaces of the cylindrical bottom electrodes 220 arranged at the center of the group pattern 239f may not contact edges of the first through fourth open areas 232f, 234f, 236f, and 238f. About 1/25 of all of the cylindrical bottom electrodes 220 do not contact edges of the first through fourth open areas 232f, 234f, 236f, and 238f.

Figure 3G:
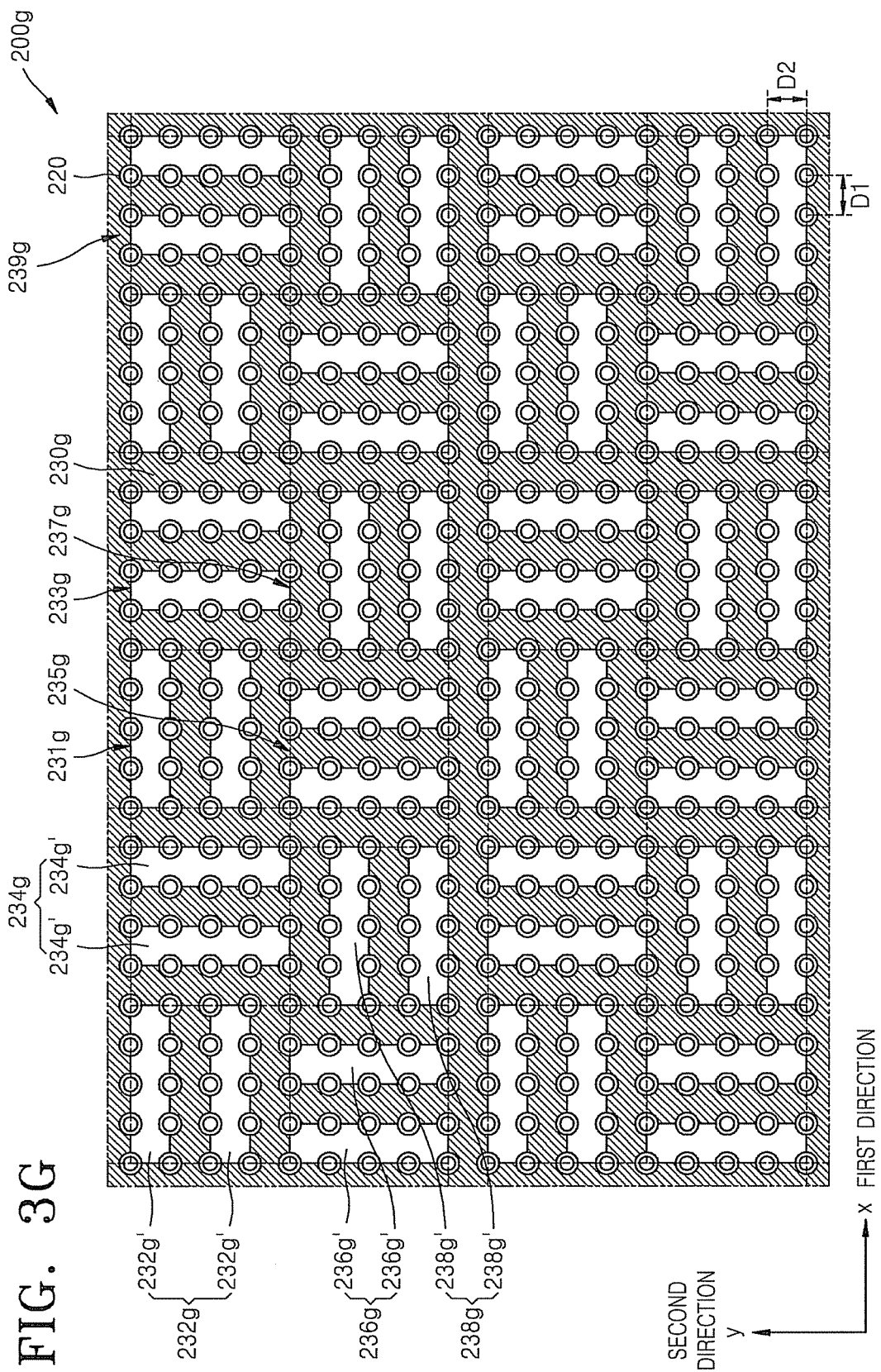

Referring to FIG. 3G; a semiconductor memory device 200g includes the plurality of cylindrical bottom electrodes 220 and a supporting base 230g for supporting the cylindrical bottom electrodes 220.

The supporting base 230g includes first patterns 231g in which first open areas 232g are formed, second patterns 233g in which second open areas 234g are formed, third patterns 235g in which third open areas 236g are formed, and fourth patterns 237g in which fourth open areas 238g are formed. The first pattern 231g arranged in the upper-left portion of the supporting base 230g, the second pattern 233g arranged in the upper-right portion of the supporting base 230g, the third pattern 235g arranged in the lower-left portion of the supporting base 230g, and the fourth pattern 237g arranged in the upper-right portion of the supporting base 230g may be referred to as a group pattern 239g.

As shown in FIG. 3G, the group pattern 239g may be repetitively arranged in the first direction to be apart from each other by D1 and to be apart from each other by D2 in the second direction. Therefore, the first pattern 231g and the second pattern 233g may be alternately arranged in the first direction, and the third pattern 235g and the fourth pattern 237g may be alternately arranged in the first direction. Furthermore, the first pattern 231g and the third pattern 235g may also be alternately arranged in the second direction, and the second pattern 233f, and the fourth pattern 237g may also be alternately arranged in the second direction.

In the embodiment shown in FIG. 3G, the first through fourth patterns 231g, 233g, 235g, and 237g may be defined as rectangular or square areas with a dimension 4×D1 in the first direction and a dimension 4×D2 in the second direction. In this case, each of the first through fourth patterns 231g, 233g, 235g, and 237g of the supporting base 230g may contact at least portions of side surfaces of the twenty-five cylindrical bottom electrodes 220.

The first and fourth open areas 232g and 238g may have two first elongated openings 232g' and two fourth elongated openings 238g', of which the lengthwise direction is parallel to the first direction, respectively, where the first and fourth elongated openings 232g' and 238g' have a dimension 2×D1 in the first direction and a dimension D2 in the second direction. Furthermore, the second and third open areas 234g and 236g may have two second elongated openings 234g' and two third elongated openings 236g', of which the lengthwise direction is parallel to the second direction, respectively, where the second and third elongated openings 234g' and 236g' have a dimension D1 in the first direction and a dimension 2×D2 in the second direction.

As shown in FIG. 3G the first elongated openings 232g' may be arranged in the first pattern 231g to be apart from each other by D2 in the −y-axis direction from above. The fourth elongated openings 238g' may be arranged in the fourth pattern 237g to be apart from each other by D2 in the second direction from below. The second elongated openings 234g' may be arranged in the second pattern 233g to be apart from each other by D1 in the −x-axis direction from right. The third elongated openings 236g' may be arranged in the third pattern 235g to be apart from each other by D1 in the first direction from left.

As shown in FIG. 3G, side surfaces of the cylindrical bottom electrodes 220 arranged at the center of the group pattern 239g may not contact edges of the first through fourth elongated openings 232g', 234g', 236g', and 238g'. About 1/81 of all of the cylindrical bottom electrodes 220 do not contact edges of the first through fourth elongated openings 232g', 234e, 236g', and 238g'.

Figure 3H:
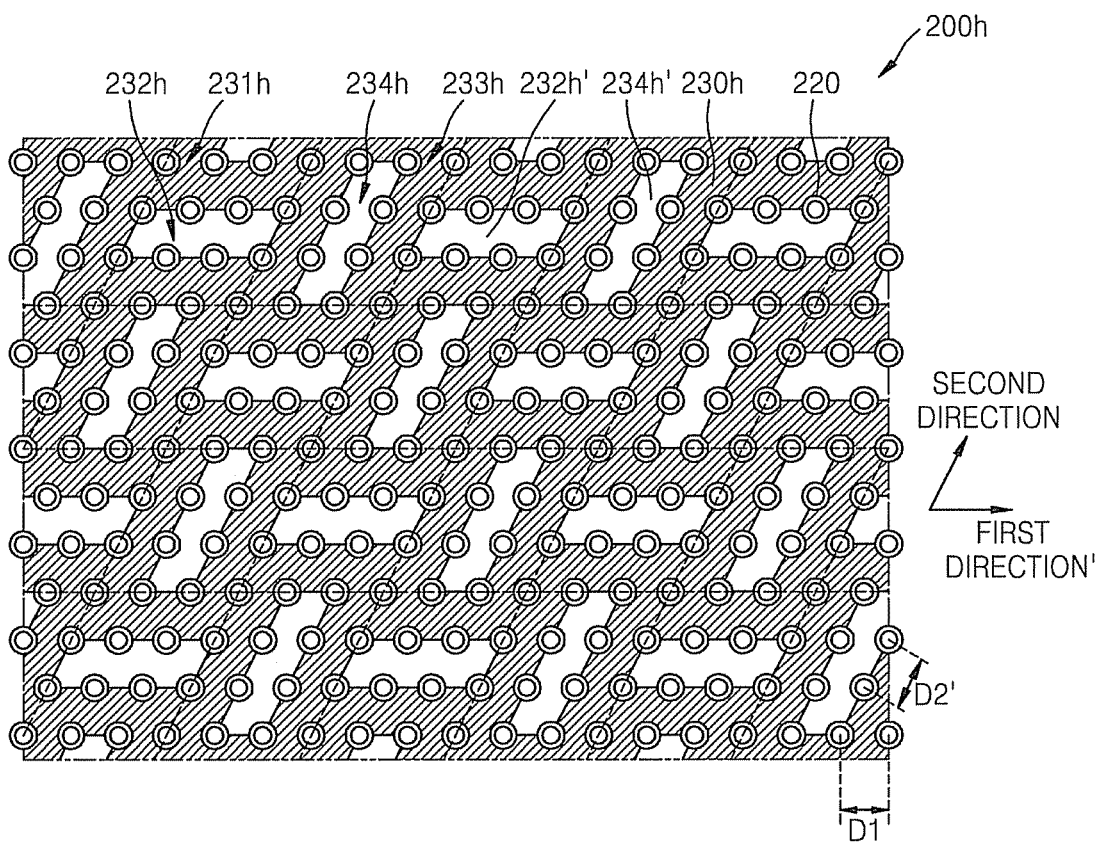
Figure 3I:
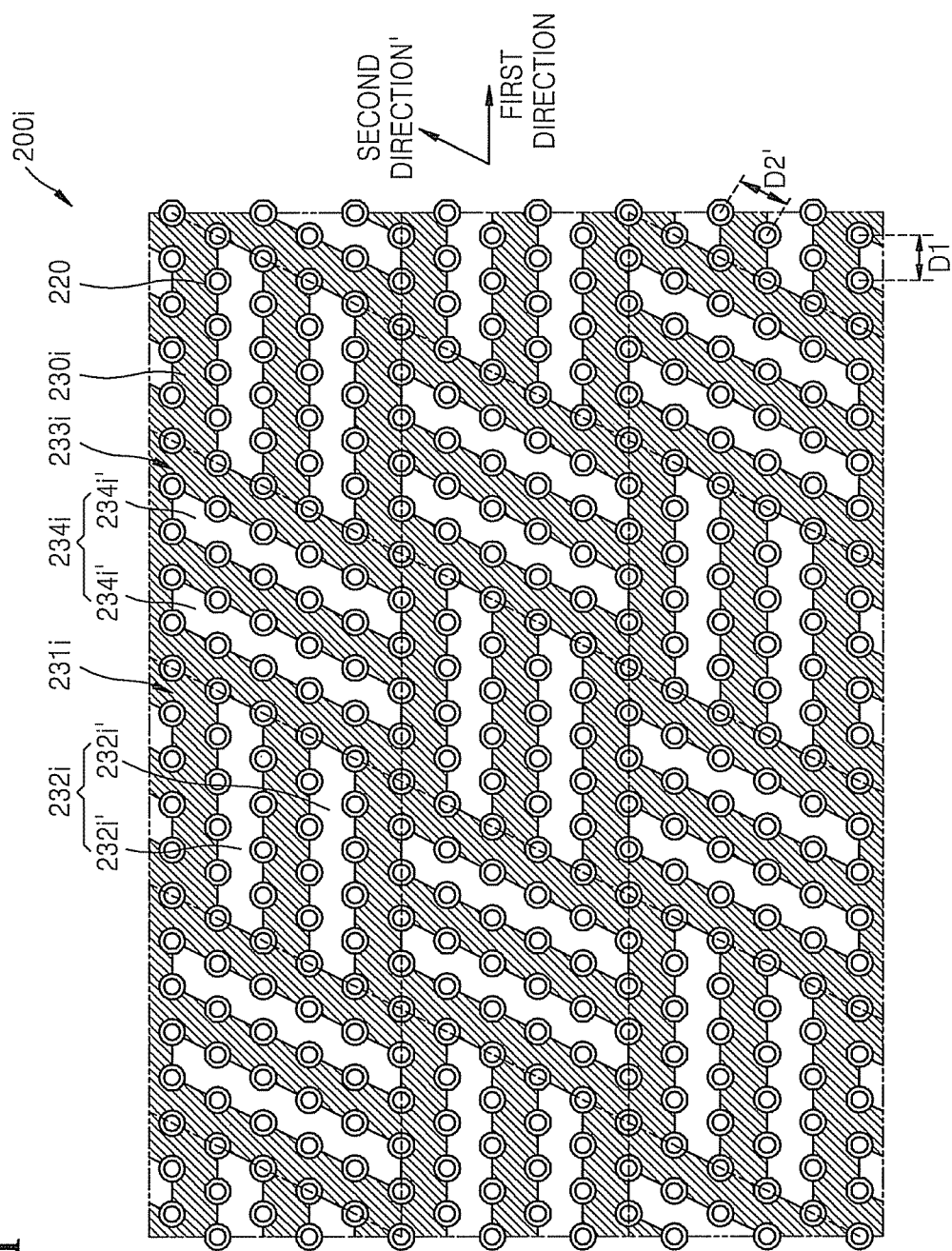
Figure 3J:
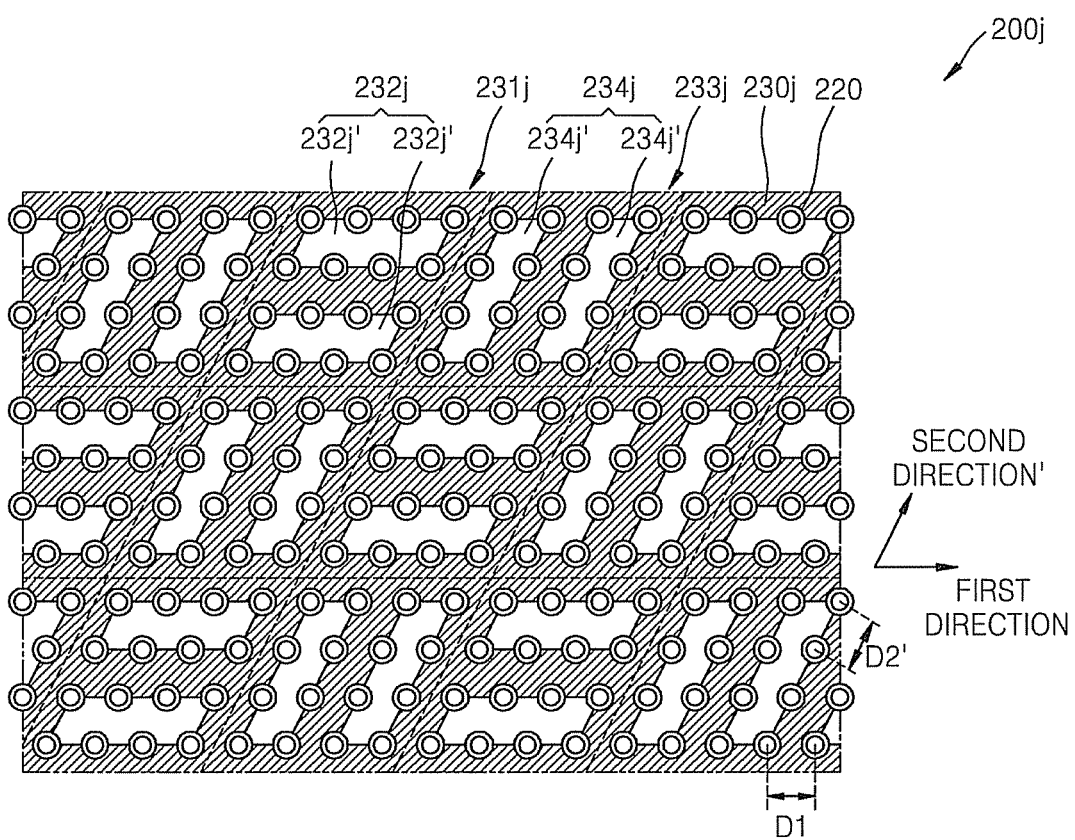

Referring to FIGS. 3H through 3J, semiconductor memory devices 200h through 200j are modified embodiments of the semiconductor memory devices 200a, 200b, and 200d as shown in FIGS. 3A, 3B, and 3D, respectively, and include the plurality of cylindrical bottom electrodes 220 and supporting bases 230h through 230j for supporting the cylindrical bottom electrodes 220, respectively.

The plurality of cylindrical bottom electrodes 220 may be repetitively arranged in the first direction and the second direction. The plurality of cylindrical bottom electrodes 220 may be arranged to be apart from each other by the first pitch D1 in the first direction and may be arranged to be apart from each other by the second pitch D2 in the second direction. An angle formed between the first direction and the second direction may be an acute angle, and thus the plurality of cylindrical bottom electrodes 220 may be arranged in a hexagonal matrix.

The cylindrical bottom electrodes 220 of the semiconductor memory devices 200a, 200b, and 200d are arranged in a perpendicular matrix, and the plurality of cylindrical bottom electrodes 220 of the semiconductor memory devices 200h through 200j shown in FIGS. 3H through 3J, respectively, are arranged in a hexagonal matrix. Nonetheless, the technical spirit of the example embodiments of the inventive concepts applied to the supporting bases 230a, 230b, and 230d may be identically applied to the cylindrical bottom electrodes 220 arranged in a hexagonal matrix.

The supporting bases 230h, 230i, and 230j correspond to the supporting bases 230a, 230b, and 230d, respectively, whereas components included in the supporting bases 230h, 230i, and 230j also correspond to components included in the supporting bases 230a, 230b, and 230d.

Although FIGS. 3H through 3J show modified examples of the semiconductor memory devices 200a, 200b, and 200d of FIGS. 3A, 3B, and 3D, respectively, the semiconductor memory devices 200c, 200e, and 200f of FIGS. 3C, 3E, and 3F may also be applied to structures in which the cylindrical bottom electrodes 220 are arranged in a hexagonal matrix.

Figure 4A:
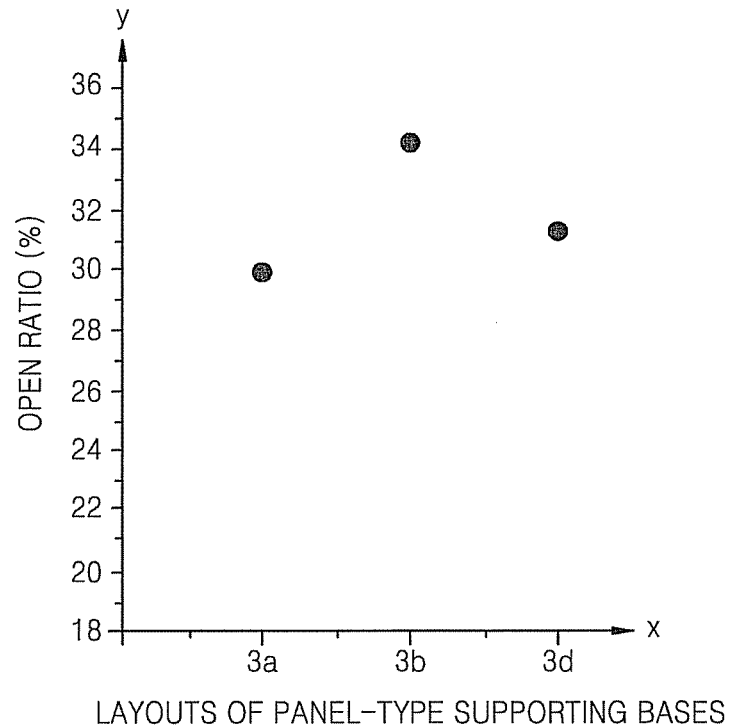
FIGS. 4A and 4B are graphs showing results of simulation experiments for comparing layouts of supporting bases of semiconductor memory devices according to some example embodiments of the inventive concepts, where
Figure 4B:
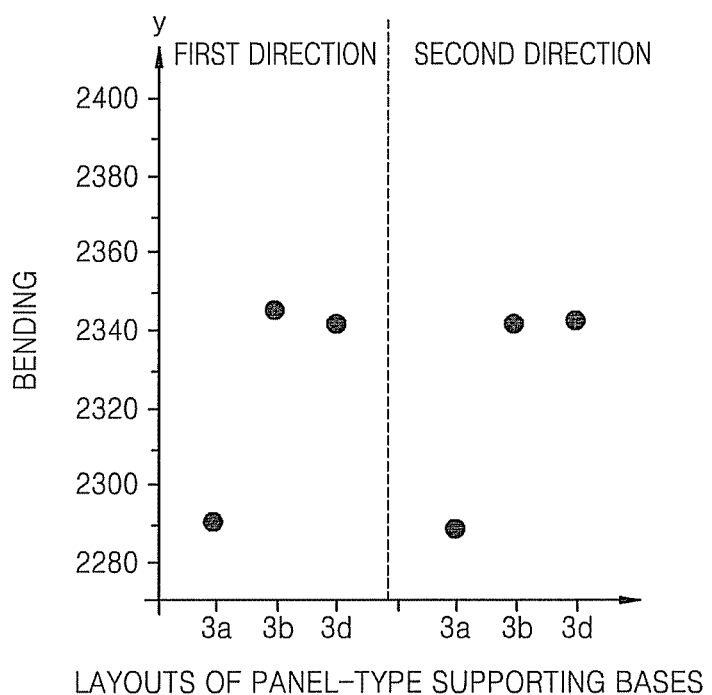

FIGS. 4A and 4B are graphs showing results of simulation experiments for comparing layouts of supporting bases of semiconductor memory devices according to example embodiments. FIG. 4A shows open ratio, that is ratio of open areas with respect to the entire areas of the layouts supporting bases, and FIG. 4B shows bending in the first direction and the second direction with respect to layouts of supporting bases.

In the graph shown in FIG. 4A, the x-axis indicates layouts of the supporting base as shown in FIGS. 3A, 3B, and 3D, whereas the y-axis indicates ratio of open areas with respect to the entire areas of the layouts.

The layout of the supporting base according to the example embodiments as shown in FIG. 3A exhibits about 30% open ratio, the layout of the supporting base according to the example embodiments as shown in FIG. 3B exhibits about 34.5% open ratio, and the layout of the supporting base according to the example embodiment as shown in FIG. 3D exhibits about 31.5% open ratio.

If an open ratio is small, it is more difficult to perform subsequent operations for forming a dielectric layer or a top electrode on surfaces of cylindrical bottom electrodes, because subsequent material deposition characteristics deteriorate due to asymmetrical or rough deposition of subsequent materials, such as a material for forming a dielectric layer, at a small open ratio. Therefore, it is necessary to secure a sufficient open ratio for performing subsequent operations, and open ratios above about 30% are secured in the semiconductor memory devices according to example embodiments of the inventive concepts.

In the graph shown in FIG. 4B, the x-axis indicates layouts of the supporting base as shown in FIGS. 3A, 3B, and 3D, whereas the y-axis indicates degrees at which the layouts bend. The left portion of the graph shown in FIG. 4B indicates a degree of bending in the first direction, whereas the right portion of the graph shown in FIG. 4B indicates a degree of bending in the second direction. However, values of the y-axis are result values of simulations for comparing the layouts to each other, where the values are only relatively compared and do not have absolute definitions.

The layout of the supporting base as shown in FIG. 3A bends in the first direction by about 2290 and bends in the second direction by about 2288. The layout of the supporting base as shown in FIG. 3B bends in the first direction by about 2347 and bends in the second direction by about 2344. The layout of the supporting base as shown in FIG. 3D bends in both the first direction and the second direction by about 2344.

It appears that each of the layouts of the supporting bases, as shown in FIGS. 3A, 3B, and 3D, bends in the first direction and the second direction by similar degrees, probably because a configuration viewed in the first direction and a configuration viewed in the second direction are the same.

Analyses of devices corresponding to example embodiments of the inventive concepts indicate that cylindrical bottom electrodes lean, break, and rip off, and a supporting base cracks mainly because the supporting base bends. Therefore, a layout of a supporting base for minimizing bending of the supporting base is suggested. The layouts of the supporting bases, as shown in FIGS. 3A, 3B, and 3D, are designed such that the configuration viewed in the first direction and the configuration viewed in the second direction are the same. Therefore, bending of the supporting bases may be reduced in both the first direction and the second direction. Furthermore, the layouts of the supporting bases are designed to secure sufficient ratios of open areas with respect to the entire area of the supporting bases, that is, open ratios for subsequent operations, e.g., open ratios above 30%.

If stress exerted on cylindrical bottom electrodes due to bending of a supporting base becomes a serious problem, the layout of the supporting base as shown in FIG. 3A, which has less bending than the layouts of the supporting bases as shown in FIGS. 3B and 3D may be employed. If uniform deposition of following materials becomes a serious problem, the layouts of the supporting bases, as shown in FIGS. 3B and 3D, which have higher open ratios than the layout of the supporting base as shown in FIG. 3A may be employed.

FIGS. 5A through 5G are sectional views sequentially showing a method of fabricating a semiconductor memory device, according to an embodiment of the inventive concepts, taken along a line V-V' of FIG. 3A. Although FIGS. 5A through 5G are schematic diagrams for describing a method of fabricating the semiconductor memory device 200a shown in FIG. 3A, it would be apparent to one having ordinary skill in the art that the method of fabrication as described below may be similarly applied to method of fabricating the semiconductor memory devices 200b through 200j of FIGS. 3B through 3J.

Figure 5A:
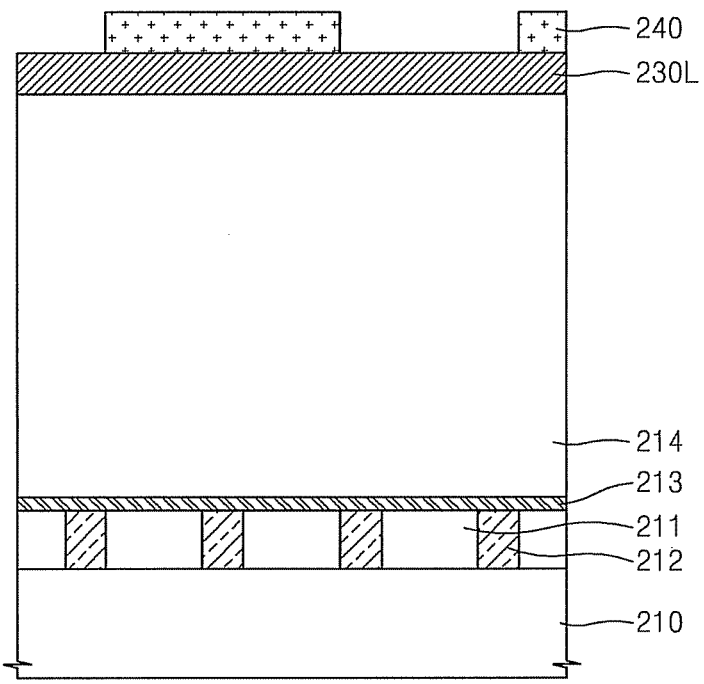
FIGS. 5A through 5G are sectional views sequentially showing a method of fabricating a semiconductor memory device, according to an example embodiment of the inventive concepts, taken along a line V-V' of FIG. 3A.

Referring to FIG. 5A, a first mold layer 214 is formed on an interlayer insulation layer 211, a contact plug 212, and an anti-etching layer 213, which are formed on a substrate 210, and a supporting base layer 230L is formed on the first mold layer 214, where a cell region and a dummy region are defined in the substrate 210. The supporting base layer 230L may have a thickness from about 10 nm to about 500 nm. A mask pattern 240 for patterning the supporting base layer 230L is formed on the supporting base layer 230L. The mask pattern 240 may be formed to have a pattern corresponding to the first open areas 232a and the second open areas 234a of FIG. 3A. The planar shape of the mask pattern 240 may be rectangular, square, parallelogram, elliptical, or circular according to arrangement of cylindrical bottom electrodes and a layout of a supporting base.

The mask pattern 240 is arranged between cylindrical bottom electrodes adjacent to each other. Therefore, the mask pattern 240 may have a width substantially corresponding to an interval between the cylindrical bottom electrodes, that is, the first pitch D1 or the second pitch D2. The mask pattern 240 may be a photoresist pattern.

The supporting base layer 230L may be formed of a material with an etching selectivity different from that of the first mold layer 214. For example, if the first mold layer 214 is removed through a Limulus amoebocyte lysate (LAL) lift-off process, the supporting base layer 230L may be formed of a material with a low etch rate with respect to LAL and dielectric characteristics. If the first mold layer 214 is formed of $SiO_2$, SiGe, Si, or a carbon-based material layer, the supporting base layer 230L may be formed of SiN, SiCN, TaO, or $TiO_2$. However, materials for forming the supporting base layer 230L are not limited thereto.

Figure 5B:
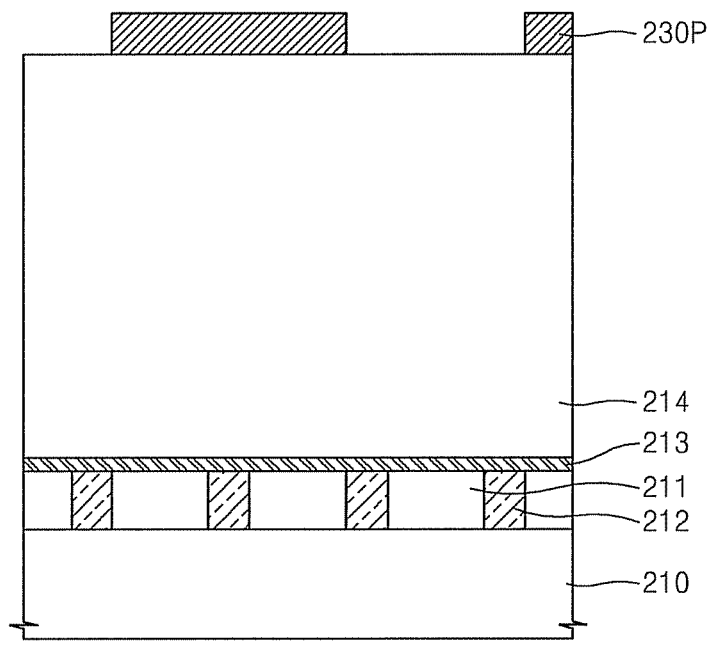

Referring to FIG. 5B, the first mold layer 214 exposed between a supporting base pattern 230P is shown. For example, the supporting base pattern 230P is formed by dry-etching the supporting base layer 230L by using the mask pattern 240 as an etching mask.

Figure 5C:
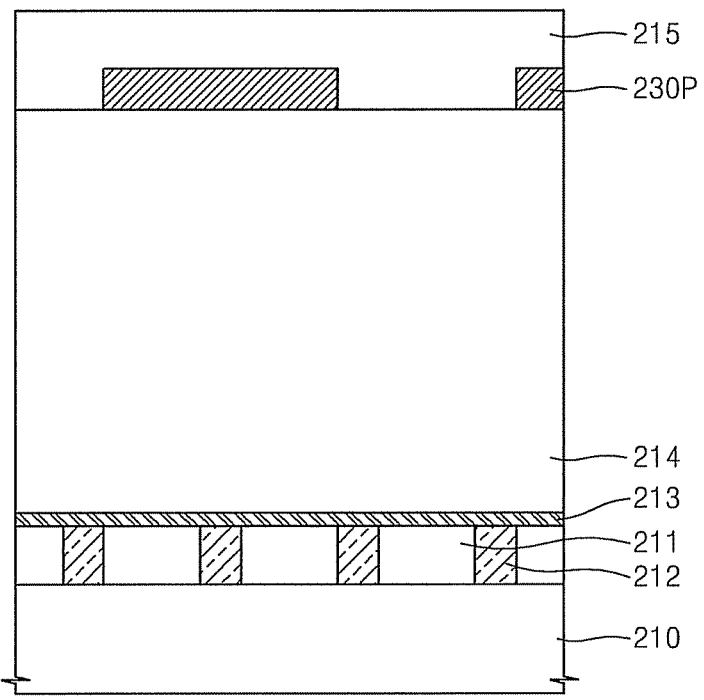

Referring to FIG. 5C, a second mold layer 215 is formed on the first mold layer 214 and the supporting base pattern 230P. The second mold layer 215 may be formed of the same material as the first mold layer 214 or a material with a similar etch rate with the first mold layer 214. For example, in the case of removing the first mold layer 214 and the second mold layer 215 through a LAL lift-off process, the second mold layer 215 may be formed of a material with an etch rate less than 10% different from that of the first mold layer 214. The second mold layer 215 may be formed to have a sufficient thickness to cover the supporting base pattern 230P, and the thickness of the second mold layer 215 may be at least 50 nm. Furthermore, a sum of the thicknesses of the first mold layer 214 and the second mold layer 215 may be from about 1,000 nm to about 4,000 nm.

Figure 5D:
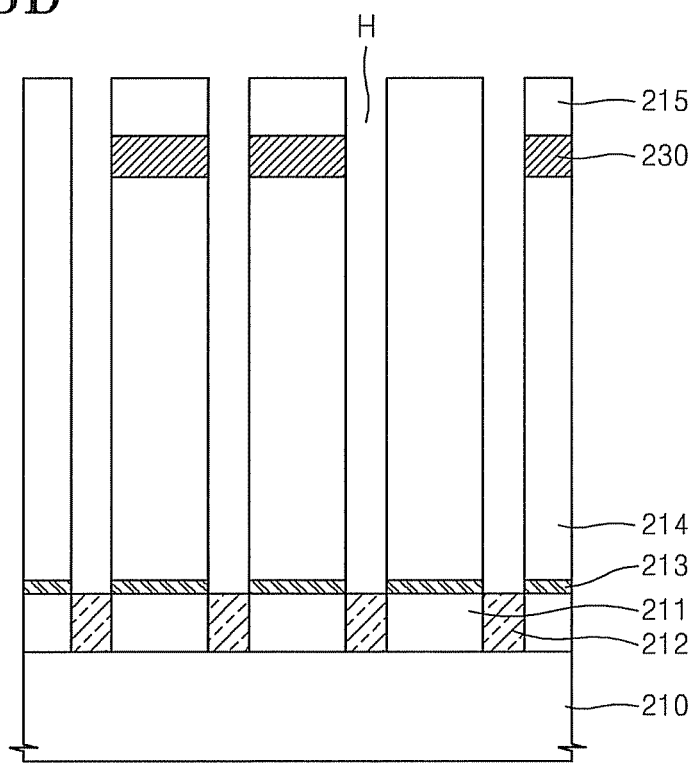

Referring to FIG. 5D, a plurality of holes H are formed at locations at which cylindrical bottom electrodes are to be formed, by etching the second mold layer 215, the supporting base pattern 230P, the first mold layer 214, and the anti-etching layer 213 until the contact plug 212 is exposed. As the holes H are formed in the supporting base pattern 230P, the supporting base pattern 230P has a shape substantially the same as that of the supporting base 230, as shown in FIG. 3A. The holes H are formed such that a plurality of cylindrical bottom electrodes form a perpendicular matrix or a hexagonal matrix, as shown in FIG. 3A or FIG. 3H.

Figure 5E:
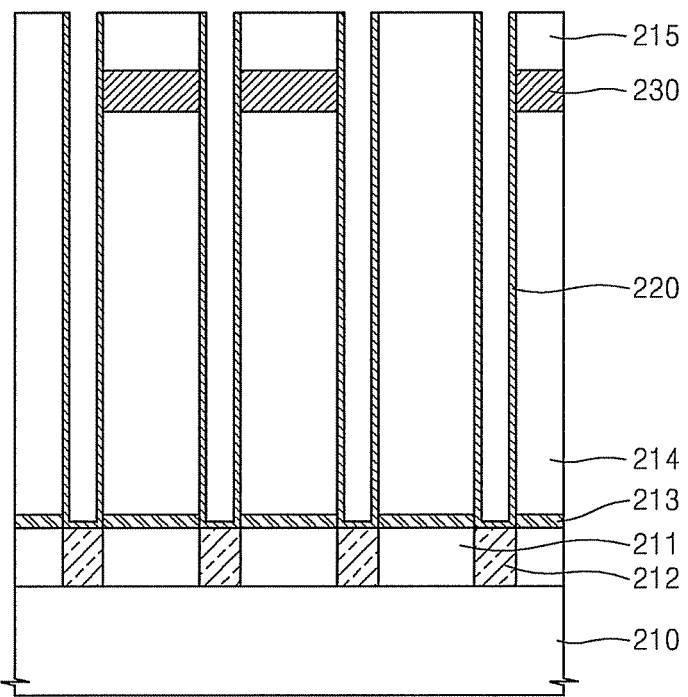

Referring to FIG. 5E, a plurality of cylindrical bottom electrodes 220 are formed by depositing a conductive material on inner surfaces of the holes H and the second mold layer 215. The cylindrical bottom electrodes 220 are formed by depositing the conductive material, forming a cover layer (not shown) on the entire substrate 210 to cover the holes H, and removing the cover layer and the conductive material by performing an etch-back process and/or a chemical mechanical polishing (CMP) process until a top surface of the second mold layer 215 is exposed. The cylindrical bottom electrodes 220 may be formed of poly-silicon or titanium nitride (TiN), for example, but the embodiment is not limited thereto. The cover layer may be removed by performing an etch-back process, whereas the conductive material on the second mold layer 215 may be removed by performing the CMP process. The cover layer may be formed of the same material as the first mold layer 214 and the second mold layer 215 or a material with a similar etching selectivity. The cover layer may be an oxide layer, for example.

Figure 5F:
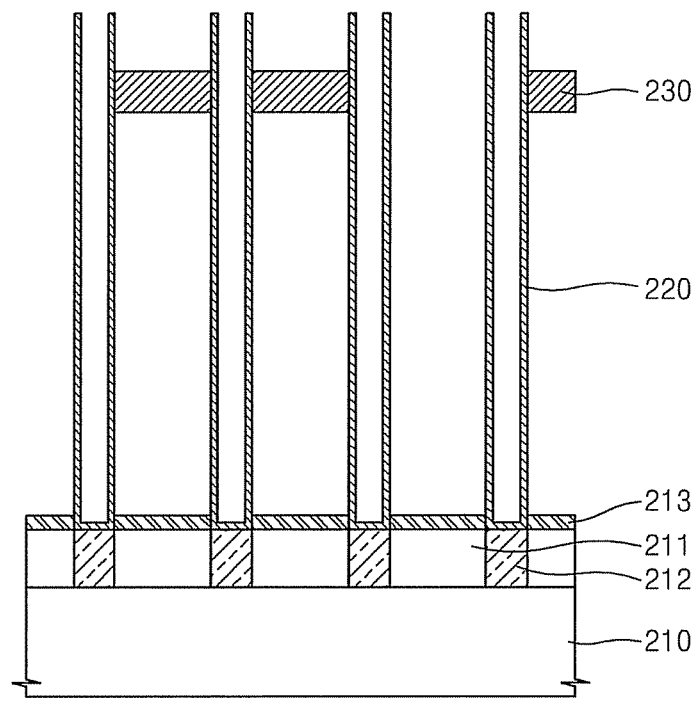

Referring to FIG. 5F, after the formation of the cylindrical bottom electrodes 220, the first mold layer 214 and the second mold layer 215 are removed by wet-etching process. Furthermore, the cover layer may be removed together with the first mold layer 214 and the second mold layer 215 or separately from the first mold layer 214 and the second mold layer 215.

For example, the first mold layer 214, the second mold layer 215, and the cover layer may be removed by performing a lift-off process using hydrofluoric acid or LAL. Therefore, as described above, the supporting base 230 may have a lower etch rate with respect to LAL than those of the first mold layer 214 and the second mold layer 215.

The cylindrical bottom electrodes 220 are supported by the supporting base 230 as described above. The plan view of FIG. 3A shows the substrate 210 of FIG. 5F viewed from above.

Figure 5G:
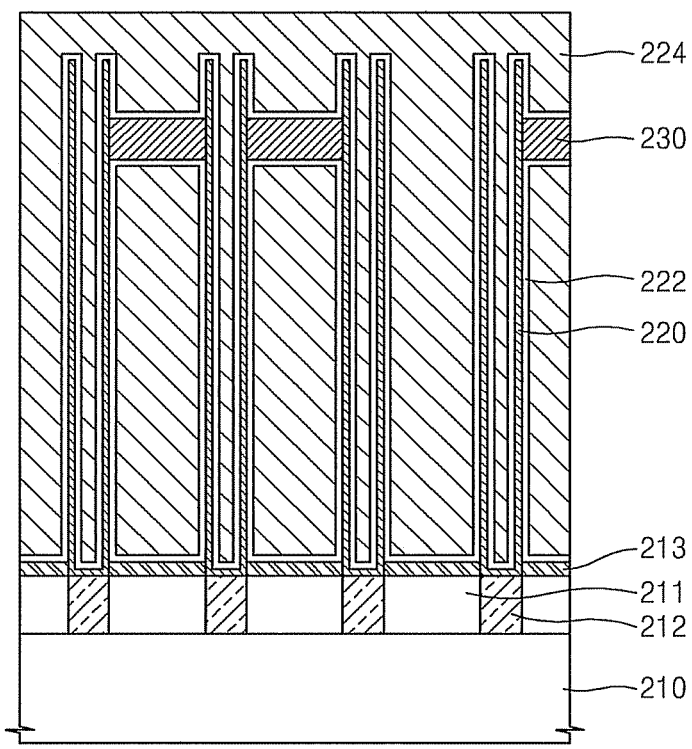

Referring to FIG. 5G, after the first mold layer 214, the second mold layer 215, and the cover layer are removed, a DRAM cell capacitor is fabricated by forming the dielectric layer 222 and the top electrode 224 on the cylindrical bottom electrodes 220. Materials constituting the dielectric layer 222 and the top electrode 224 may be uniformly deposited over portions of the cylindrical bottom electrodes 220 below the supporting base 230 via the open areas 232a and 234a, which are formed in the supporting base 230. Thus, the top electrode 224 may include at least portions between the bottom electrodes (220) and the supporting base (230).

Figure 6:
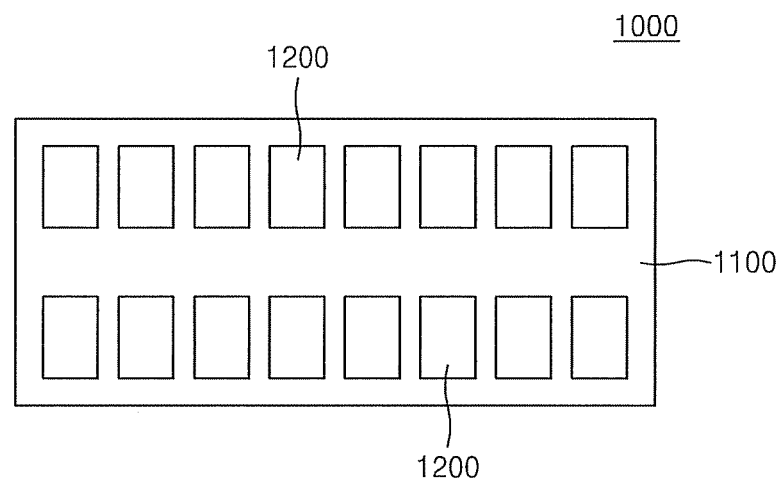
FIG. 6 is a plan view of a memory module including a semiconductor memory device according to an example embodiment of the inventive concepts.

FIG. 6 is a plan view of a memory module 1000 including a semiconductor memory device according to an example embodiment of the inventive concepts.

The memory module 1000 may include a printed circuit board (PCB) 1100 and a plurality of semiconductor packages 1200.

The plurality of semiconductor packages 1200 may include semiconductor memory devices according to embodiments of the inventive concepts. Especially, the plurality of semiconductor packages 1200 may include the featured structure of at least one selected from among the semiconductor memory devices according to embodiments of the inventive concepts as described above.

The memory module 1000 according to an example embodiment of the inventive concepts may be a single in-lined memory module (SIMM), in which the plurality of semiconductor packages 1200 are formed on only one of two surfaces of the PCB 1100, or a dual in-line memory module (DIMM), in which the plurality of semiconductor packages 1200 are formed on both surfaces of the PCB 1100. Furthermore, the memory module 1000 according to an example embodiment of the inventive concepts may be a fully buffered DIMM (FBDIMM) having an advanced memory buffer (AMB) for providing signals from the outside to each of the plurality of semiconductor packages 1200.

Figure 7:
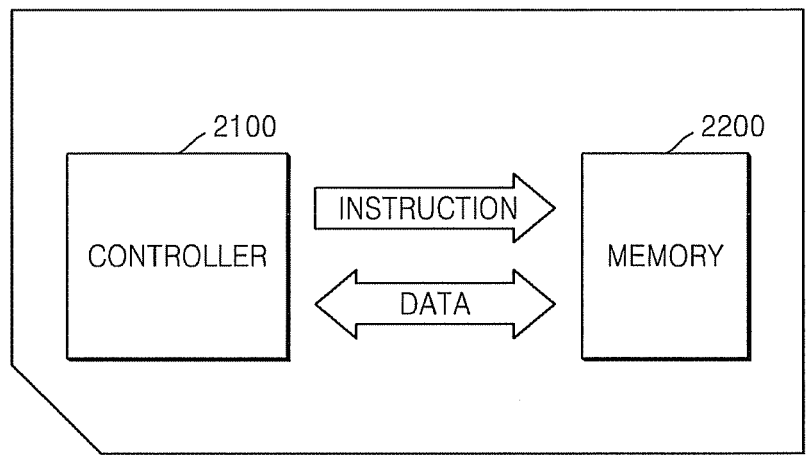
FIG. 7 is a schematic diagram of a memory card including a semiconductor memory device according to an example embodiment of the inventive concepts.

FIG. 7 is a schematic diagram of a memory card 200 including a semiconductor memory device according to an embodiment according to an example embodiment of the inventive concepts.

The memory card 2000 may be arranged such that a controller 2100 and a memory 2200 exchange electric signals. For example, when the controller 2100 provides an instruction, the memory 2200 may transmit data.

The memory 200 may include a semiconductor memory device according to an embodiment of the inventive concepts. Especially, the memory 2200 may include the featured structure of at least one selected from among the semiconductor memory devices according to example embodiments of the inventive concepts as described above.

The memory card 2000 may be any of various types of memory cards, such as a memory stick (MS) card, a smart media (SM) card, a secured digital (SD) card, a mini SD card, a multimedia card (MMC), or the like, but the embodiment is not limited thereto.

Figure 8:
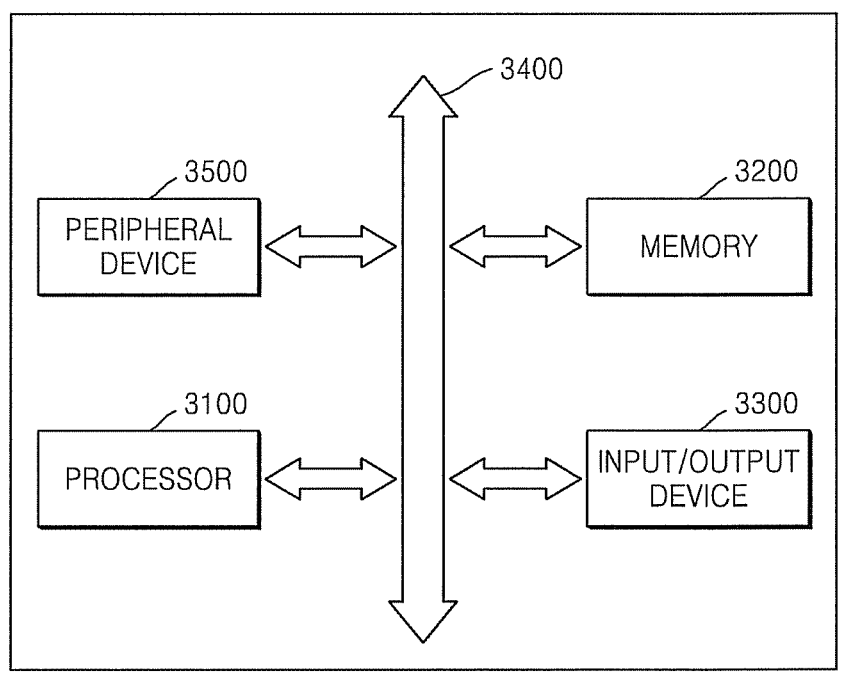
FIG. 8 is a schematic diagram of a system including a semiconductor memory device according to some example embodiments of the inventive concepts.

FIG. 8 is a schematic diagram of a system 3000 including a semiconductor memory device according to embodiments of the inventive concepts.

In the system 3000, a processor 3100, a memory 3200, an input/output device 3300, and a peripheral device 3500 may communicate with each other via a bus 3400.

The memory 3200 of the system 3000 may include a random access memory (RAM) and a read only memory (ROM). Furthermore, the system 3000 may further include other peripheral devices, such as a floppy disk drive and a compact disc (CD) ROM drive.

The memory 3200 may include a semiconductor memory device according to embodiments of the inventive concepts. Especially, the memory 3200 may include the featured structure of at least one selected from among the semiconductor memory devices according to embodiments of the inventive concepts as described above.

The memory 3200 may store codes and data for operating the processor 3100.

The system 3000 may be used in mobile phones, MP3 players, navigation devices, portable multimedia devices (PMPs), solid state disks (SSDs), or household appliances.

While the example embodiments of inventive concepts have been particularly shown and described with reference to example embodiments thereof, it will be understood that various changes in form and details may be made therein without departing from the spirit and scope of the following claims.

What is claimed is:

1. A semiconductor memory device comprising:
    a plurality of cylindrical bottom electrodes arranged in a first direction and in a second direction different from the first direction;
    a supporting base configured to support the plurality of cylindrical bottom electrodes by contacting side surfaces of the plurality of cylindrical bottom electrodes, the supporting base including first patterns in which first open areas are formed, the supporting base including second patterns in which second open areas are formed, and the first patterns and the second patterns having different oriented shapes; and
    wherein each of the second patterns have a shape of each of the first patterns rotated at an angle between the first direction and the second direction.

2. The semiconductor memory device of claim 1, wherein the first patterns and the second patterns are alternately arranged in at least one of the first direction and the second direction.

3. The semiconductor memory device of claim 1, wherein the first patterns and the second patterns are arranged to contact each other.

4. The semiconductor memory device of claim 1, wherein each of the first open areas comprise at least one first elongated opening,
    each of the second open areas comprise at least one second elongated opening,
    the lengthwise direction of the at least one first elongated opening is parallel to the first direction, and
    the lengthwise direction of the at least one second elongated opening is parallel to the second direction.

5. The semiconductor memory device of claim 1, wherein the plurality of cylindrical bottom electrodes are arranged to be apart from each other by a first pitch in the first direction and to be apart from each other by a second pitch in the second direction, and
    each of the first patterns and each of the second patterns have dimensions corresponding to n times the first pitch in the first direction and dimensions corresponding to n times the second pitch in the second direction, where n is a natural number equal to or greater than 3.

6. The semiconductor memory device of claim 5, wherein, n is an odd number,
the first open areas and the second open areas of the supporting base corresponding to the first patterns and the second patterns contact at least portions of side surfaces of $(n+1)^2$ cylindrical bottom electrodes,
the first open areas of each of the first patterns comprises $(n-1)/2$ first elongated openings,
the second open areas of each of the second patterns comprises $(n-1)/2$ second elongated openings,
each of the first elongated openings has a dimension corresponding to n times the first pitch in the first direction and a dimension corresponding to the second pitch in the second direction, and
each of the second elongated openings has a dimension corresponding to the first pitch in the first direction and a dimension corresponding to n times the second pitch in the second direction.

7. The semiconductor memory device of claim 6, wherein the first elongated openings and the second elongated openings each contact at least portions of side surfaces of $2(n+1)$ cylindrical bottom electrodes.

8. The semiconductor memory device of claim 6, wherein the first open area of each of the first patterns comprises a plurality of the first elongated openings and the second open area of each of the second patterns comprises a plurality of the second elongated openings,
each of the first elongated openings are apart from each other by the second pitch in the second direction, and
each of the second elongated openings are apart from each other by the first pitch in the first direction.

9. The semiconductor memory device of claim 6, wherein some of the plurality of cylindrical bottom electrodes do not contact edges of the first elongated openings and the second elongated openings.

10. The semiconductor memory device of claim 9, wherein fewer than 12% of the cylindrical bottom electrodes do not contact edges of the first elongated openings and the second elongated openings.

11. The semiconductor memory device of claim 5, wherein,
n is an even number,
the first open areas and the second open areas of the supporting base corresponding to the first patterns and to the second patterns contact at least portions of side surfaces of $n^2$ cylindrical bottom electrodes,
the first open areas of each of the first patterns comprises n/2 first elongated openings,
the second open area of each of the second patterns comprises n/2 second elongated openings,
each of the first elongated openings has a dimension corresponding to $(n-1)$ times the first pitch in the first direction and a dimension corresponding to the second pitch in the second direction, and
each of the second elongated openings has a dimension corresponding to the first pitch in the first direction and a dimension corresponding to $(n-1)$ times the second pitch in the second direction.

12. The semiconductor memory device of claim 11, wherein the first elongated openings and the second elongated openings each contact at least portions of side surfaces of 2n cylindrical bottom electrodes.

13. The semiconductor memory device of claim 1, wherein the supporting base further comprises third patterns in which third open areas are formed and fourth patterns in which fourth open areas are formed,
the first patterns, the second patterns, the third patterns, and the fourth patterns having different oriented shapes,
the first patterns and the second patterns are alternately arranged in the first direction, and
the third patterns and the fourth patterns are alternately arranged in the first direction, and
the first patterns and the third patterns are alternately arranged in the second direction, and the second patterns and the fourth patterns are alternately arranged in the second direction.

14. The semiconductor memory device of claim 13, wherein each of the first open areas of each of the first patterns comprises at least one first elongated opening of which the lengthwise direction is parallel to the first direction,
each of the second open areas of each of the second patterns comprises at least one second elongated opening of which the lengthwise direction is parallel to the second direction,
each of the third open areas of each of the third patterns comprises at least one third elongated opening of which the lengthwise direction is parallel to the second direction, and
each of the fourth open areas of each of the fourth patterns comprises at least one fourth elongated opening of which the lengthwise direction is parallel to the first direction.

15. A semiconductor memory device comprising:
a plurality of cylindrical bottom electrodes arranged in a first direction and a second direction different from the first direction in a memory cell area;
a supporting base configured to support the plurality of cylindrical bottom electrodes by contacting at least portions of side surfaces of the plurality of cylindrical bottom electrodes, the supporting base including a plurality of first open areas and second open areas, the first open areas and the second open areas having different oriented shapes; and
wherein each of the second open areas have a shape of each of the first open areas rotated at an angle between the first direction and the second direction.

16. A semiconductor device comprising:
a substrate;
a plurality of pillar-type structures arranged in a first direction and a second direction different from the first direction;
a supporting base configured to support the plurality of pillar-type structures by contacting at least portions of side surfaces of the plurality of pillar-type structures, the supporting base including first patterns in which first open areas are formed, the supporting base including second patterns in which second open areas are formed, and the first patterns and the second patterns having different oriented shapes; and
wherein each of the second patterns have a shape of each of the first patterns rotated at an angle between the first direction and the second direction.

17. The semiconductor device of claim 16, wherein
the first patterns and the second patterns are alternately arranged,
the pillar-type structures are cylindrical-shaped electrodes,
each of the first open areas is elongated in the first direction, and each of the first open areas is not formed on the edge areas of the supporting base.

18. The semiconductor device of claim 16, wherein
each of the pillar-type structures include a bottom electrode, the bottom electrode standing vertically on the substrate, and
each of the pillar-type structures further comprising a top electrode, the top electrode including at least portions between the bottom electrode and the supporting base.

19. The semiconductor device of claim 16, wherein
each of the second open areas is elongated in the second direction,
each of the pillar-type structures comprises TiN or polysilicon, and
each of the pillar-type structures has an aspect ratio of about 10 to about 30.

* * * * *